US012742999B2

(12) United States Patent
Giebink et al.

(10) Patent No.: US 12,742,999 B2
(45) Date of Patent: Sep. 22, 2026

(54) PHOTONIC FEEDBACK ORGANIC PHOTODIODES AND UPCONVERTERS

(71) Applicants: OLEDWorks LLC, Rochester, NY (US); The Penn State Research Foundation, University Park, PA (US)

(72) Inventors: Noel C. Giebink, State College, PA (US); Raju Lampande, University Park, PA (US); John Hamer, Rochester, NY (US); Jon-Paul S. Desormeaux, Rochester, NY (US)

(73) Assignee: OLEDWorks LLC, New York, NY (US)

( * ) Notice: Subject to any disclaimer, the term of this patent is extended or adjusted under 35 U.S.C. 154(b) by 826 days.

(21) Appl. No.: 18/050,723

(22) Filed: Oct. 28, 2022

(65) Prior Publication Data

US 2023/0133040 A1 May 4, 2023

Related U.S. Application Data

(60) Provisional application No. 63/275,026, filed on Nov. 3, 2021.

(51) Int. Cl.
*G02F 1/39* (2006.01)
*G09G 3/3233* (2016.01)
(Continued)

(52) U.S. Cl.
CPC ............. *G02F 1/39* (2013.01); *G09G 3/3233* (2013.01); *H10K 50/19* (2023.02); *H10K 59/00* (2023.02);
(Continued)

(58) Field of Classification Search
None
See application file for complete search history.

(56) References Cited

U.S. PATENT DOCUMENTS 7,273,663 B2 9/2007 Liao et al.
8,598,573 B1 * 12/2013 So .......................... H10K 39/10 438/22

(Continued)

FOREIGN PATENT DOCUMENTS

JP 2001006876 A 1/2001
JP 3426211 B2 7/2003

(Continued)

OTHER PUBLICATIONS

He et al., App. Phys. Let., 112, 243301 (2018).

(Continued)

*Primary Examiner* — Sue A Purvis
*Assistant Examiner* — Jordan M Klein

(57) ABSTRACT

An optical upconverter, comprising a photodiode coupled to a stacked organic light emitting diode (OLED), the stacked OLED comprising at least two OLED light-emitting units separated by a charge-generation layer (CGL), wherein photocurrent generated by the photodetector causes light emission from the stacked OLED. The photodiode generates a photocurrent when exposed to an input light of a first frequency band as well as light of a second frequency band which is the same as that emitted by the stacked OLED. This creates an avalanche effect that increases the amount of overall emission. The photodiode can be a layer between the electrodes of the stacked OLEDs. A constant voltage bias that is below the threshold voltage can be applied to the electrodes of the stacked OLED. The photodiode can be an admixture of two materials, preferably organic. The upconverter can be divided into pixel segments as part of a display.

17 Claims, 13 Drawing Sheets

(51) Int. Cl.

| | |
|---|---|
| ***H10K 50/19*** | (2023.01) |
| ***H10K 59/00*** | (2023.01) |
| ***H10K 59/12*** | (2023.01) |
| ***H10K 59/32*** | (2023.01) |
| ***H10K 59/38*** | (2023.01) |
| ***H10K 65/00*** | (2023.01) |
| *H10K 71/80* | (2023.01) |

(52) U.S. Cl.

CPC ............. *H10K 59/32* (2023.02); *H10K 59/38* (2023.02); *H10K 65/00* (2023.02); *H10K 59/12* (2023.02); *H10K 59/1201* (2023.02); *H10K 71/80* (2023.02)

(56) References Cited

U.S. PATENT DOCUMENTS

| | | | | |
|---|---|---|---|---|
| 9,281,487 | B2 | 3/2016 | Kim et al. | |
| 9,379,346 | B2 | 6/2016 | Forrest et al. | |
| 9,741,957 | B2 | 8/2017 | Jung et al. | |
| 10,032,834 | B2 | 7/2018 | Udaka et al. | |
| 10,134,815 | B2 | 11/2018 | So et al. | |
| 10,224,375 | B2 | 3/2019 | Popp et al. | |
| 2004/0031965 | A1* | 2/2004 | Forrest | H10K 65/00 257/79 |
| 2012/0286296 | A1* | 11/2012 | So | H10K 65/00 257/E51.012 |
| 2020/0013978 | A1 | 1/2020 | Tanaka | |
| 2021/0359004 | A1 | 11/2021 | Ai | |
| 2023/0134894 | A1* | 5/2023 | Hamer | H10K 65/00 257/40 |

FOREIGN PATENT DOCUMENTS

| | | | |
|---|---|---|---|
| JP | 3946484 | B2 | 7/2007 |
| JP | 4018070 | B2 | 12/2007 |
| JP | 6160671 | B2 | 7/2017 |
| WO | 2013/044200 | A1 | 3/2013 |

OTHER PUBLICATIONS

Yuan, C.-H. et al., Sci. Rep. 6, 32324 (2016).

Jansen-van Vuuren et al, "Organic Photodiodes: The Future of Full Color Detection and Image Sensing", Adv. Mater., 28, 4766-4802 (2016).

Ren et al, Recent Progress in Organic Photodetectors and their Applications, Adv. Sci., 8, 2002418 (2021).

Strobel et al, "Organic photodiodes: printing, coating, benchmarks, and applications", Flex. Print. Electron., 4, 043001 (2019).

Chuang et al, Proc. of SPIE vol. 6333 63331Q-1.

Chikamatsu et al, App. Phys. Let., 81(4), 769 (2002).

Tachibana et al, ACS Photonics, 4(2), 223 (2017).

Hiramoto et al, App. Phys. Let., 60, 324 (1992).

Song et al, App. Phys. Let., 9(23), 6818 (2018).

Yase et al, 2005 Pacific Rim Conference on Lasers & Electro-Optics, Tokyo, Japan, 2005, pp. 569-570.

Springer et al, Optics Express, 24 (24), 28131 (2016).

Spindler et al, "High Brightness OLED Lighting", SID Display Week 2016, San Francisco CA, May 23-27, 2016.

* cited by examiner 600
602
602
602
602
607
605
605
607
603
632
652
672
601
120
120
120

PHOTONIC FEEDBACK ORGANIC PHOTODIODES AND UPCONVERTERS

CROSS-REFERENCE TO RELATED APPLICATIONS

This application claims the benefit of U.S. Provisional Application No. 63/275,026 filed Nov. 3, 2021.

Reference is made to co-assigned and co-filed U.S. application Ser. No. 18/050,729, filed Oct. 28, 2022, entitled "DISPLAY WITH LIGHT AMPLIFICATION".

FIELD OF THE INVENTION

Embodiments relate to an optical upconverter or photodetector using a stacked OLED to provide amplified emission from an input emission.

BACKGROUND OF THE INVENTION

OLEDs coupled to photodiodes in various ways are known.

JP03946484B2 and JP03426211B2 describe an OLED with a photodiode layer between the OLED electrodes that can cause photo-amplification upon light excitation.

JP2001006876A describes an OLED with a photodiode layer between the electrodes that can cause photo-multiplication and transformation of 400 nm input light to 520 nm output light.

U.S. Ser. No. 10/134,815 describes an infrared-to-visible up-conversion device which can include an OLED coupled to a photodetector.

JP6160671B2 describes a light receiving/light emitting device where light is received from the backside by a photoconductive layer which generates current which is passed to an OLED so that light is emitted from the front side.

U.S. Ser. No. 10/032,834 describes a device with a first organic photoelectric conversion unit and a second organic photoelectric conversion unit that is disposed on the first organic photoelectric conversion unit and is different in spectral sensitivity from the first organic photoelectric conversion unit, wherein one of the organic photoelectric conversion units acts as a light receiving unit and the other acts as a light emitting unit.

He et al., App. Phys. Let., 112, 243301 (2018) describes a photodiode layer located between two OLEDs.

JP04018070B2 describes an OLED with a photodiode layer where the OLED emits light at one time and the photodiode senses light at a different time.

US20060227531 describes a device wherein light causes a photovoltaic cell to generate photocurrent that cause the OLED to emit light. The photovoltaic cell and the OLED share a common electrode.

US2004/0031965 describes an OLED located over a photodiode.

Yuan, C.-H. et al., Sci. Rep. 6, 32324 (2016) describes an OLED with a photoconductive layer which exhibits emission when irradiated with a 780 nm laser.

US20210359004 and U.S. Ser. No. 10/224,375B2 describe the use of a device where a photoconductive layer is located adjacent to an OLED.

Organic photodiode materials are well known; see, for example, Jansen-van Vuuren et al, "Organic Photodiodes: The Future of Full Color Detection and Image Sensing", Adv. Mater., 28, 4766-4802 (2016). Organic avalanche photodiodes are also well known (i.e., see Ren et al, 'Recent Progress in Organic Photodetectors and their Applications", Adv. Sci., 8, 2002418 (2021); and Strobel et al, "Organic photodiodes: printing, coating, benchmarks, and applications", Flex. Print. Electron., 4, 043001 (2019). It should be noted that photodiode, photoconductor and photodetector are terms that can be used interchangeably to describe these types of devices and modes of operation.

Some other OLED based IR-to-visible emission devices are described in Chuang et al, Proc. of SPIE Vol. 6333 63331Q-1; Chikamatsu et al, App. Phys. Let., 81(4), 769 (2002); Tachibana et al, ACS Photonics, 4(2), 223 (2017); Hiramoto et al, App. Phys. Let., 60, 324 (1992); Song et al, App. Phys. Let., 9(23), 6818 (2018); Yase et al, 2005 Pacific Rim Conference on Lasers & Electro-Optics, Tokyo, Japan, 2005, pp 569-570.

OLED devices with multiple light-emitting units (stacks) are known; for example, U.S. Pat. Nos. 7,273,663, 9,379,346, 9,741,957; 9,281,487 and US2020/0013978 all describe OLED stacks with multiple stacks of light-emitting OLED units, each separated by intermediate charge generation layers (CGLs, sometimes also referred to as intermediate connecting layers). Springer et al, Optics Express, 24 (24), 28131 (2016) reports OLED stacks with 2- and 3-light-emitting units, where each unit has a different color. OLED stacks of up to six light-emitting units have been reported (Spindler et al, "High Brightness OLED Lighting", SID Display Week 2016, San Francisco Calif., May 23-27, 2016).

None of the above references can provide an upconverter device that provides as much emission as desired from the inputted light.

BRIEF SUMMARY OF THE INVENTION

Embodiments relate to an optical upconverter that includes a photodiode (PD) layer coupled to a stacked organic light emitting diode (OLED) with two or more light-emitting units separated by a charge-generation layer (CGL) wherein exposure of the PD to inputted light causes the OLED to emit. The emission from the stacked OLED then facilitates avalanche mode operation via a self-amplifying positive feedback loop.

The PD can be configured to operate with light that falls within a first frequency band as well as a second frequency band. Light within the first frequency band incident upon the PD can cause the PD to generate a photocurrent. The photocurrent is directed to the stacked OLED and causes the stacked OLED to generate light within the second frequency band. Since the PD is sensitive to the second frequency light, additional photocurrent is generated and establishes an avalanche mode which increase the amount of light generated from the stacked OLED.

The upconverter unit can include a light absorbing structure which is configured to absorb light generated by the stacked OLED. The upconverter unit can include physical or electrical barrier structures which are configured to reduce or limit the lateral movement of charge carriers or light within the device.

The optical upconverter can be used in an optical system such as optical connectors, optical couplers, a night vision system or a full color or monochrome display.

BRIEF DESCRIPTION OF THE FIGURES

The above and other objects, aspects, features, advantages, and possible applications of the present invention will be more apparent from the following more particular description thereof, presented in conjunction with the following drawings. It should be understood that like reference numbers used in the drawings may identify like components. Drawings are not to scale.

DETAILED DESCRIPTION OF THE INVENTION

Figure 1:
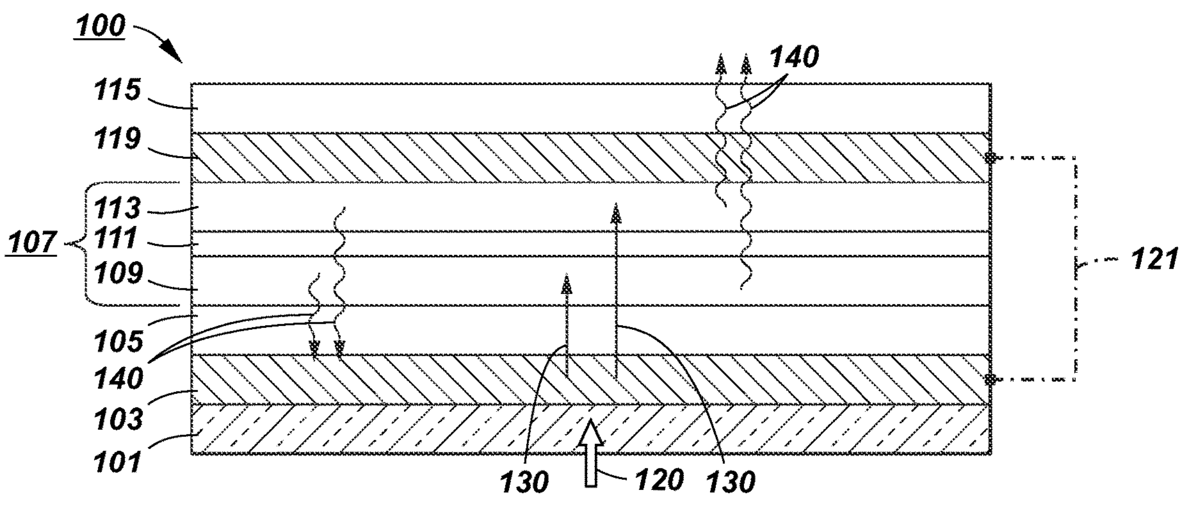
FIG. 1 shows a schematic cross-section view of 100, which is one embodiment of the invention.

For the purposes of this disclosure, the terms "over" or "above" mean that the structure involved is located above another structure, that is, on the side opposite from the substrate. "Top", "uppermost" or "upper" refers to a side or surface further from the substrate while "bottom", "bottommost" or "bottom" refers to the side or surface closest to the substrate. Unless otherwise noted, "over" should be interpreted as either that the two structures may be in direct contact or there may be intermediate layers between them. By "layer", it should be understood that a layer has two sides or surfaces (an uppermost and bottommost) and that multiple layers may be present and is not limited to a single layer.

"LEL" means light-emitting layer. For light-emitting units or layers, R indicates a layer that primarily emits red light (>600 nm, desirably in the range of 620-660 nm), G indicates that a layer primarily emits green light (500-600 nm, desirably in the range of 540-565 nm) and B indicates a layer that primarily emits blue light (<500 nm, desirably in the range of 440-485 nm). IR refers to infrared light, generally understood to encompass wavelengths from around 1 millimeter (300 GHz) to the nominal red edge of the visible spectrum, around 700 nanometers. Near-IR (NIR) refers to infrared light that just outside the range of human vision, generally considered to be in the range of around 750 nm-900 nm. UV refers to ultraviolet light, generally considered to be wavelengths shorter than around 400 nm. It is important to note that light-emitting layers can produce some degree of light outside the indicated range, but the amount is always less than the primary color. Y (yellow) indicates that a layer emits significant amounts of both R and G light with a much lesser amount of B light. W (white) indicates that a layer emits significant amounts of R, G and B light, although not necessarily at exactly equal amounts. Unless otherwise noted, wavelengths are expressed in vacuum values and not in-situ values.

An important consideration in increasing the overall amount of light emission through amplification is the number of light-emitting units or stacks present in the OLED part of the device. A number of OLED light-emitting units can be stacked on top of one another so there are multiple sources of light within the device. The individual OLED light-emitting units (an OLED "stack") may have a single light-emissive layer or may have more than one light-emitting layer (either directly adjacent to each other or separated from each other by interlayers). The individual light-emitting units may also contain various kinds of non-emitting layers such as hole transporting layers, electron-transporting layers, blocking layers and others known in the art to provide desirable effects such as promoting emission and managing charge transfer across the light-emitting unit. Within the stack, all or some of the individual light-emitting layers may be the same or they all may be different from each other.

An individual OLED light-emitting unit can emit a single color of visible light (i.e., R, G or B). The single color of light may be generated within the OLED unit by a single layer with one or more emitters of the same color or multiple layers, each with the same or different emitters whose primary emission fall within the same color. A single OLED unit can also provide a combination of two colors (i.e., R+G, R+B, G+B) within a single OLED unit by having: one layer with a single emitter that emits two colors of light, one layer with two different emitters, or combinations of multiple separate layers, each emitting a single, but different, color. A single OLED unit may also provide white light (a combination of R, G and B) by having one layer that emits all three colors of light or combinations of multiple separate layers, each emitting a single (but different) color, the sum of which is white. It is also possible that IR or NIR emitter molecules could be included in all or some of the OLED units of the stacked OLED or separate OLED units could be added which generate only IR or NIR light. This will enhance the avalanche mode since some of the IR or NIR light emitted by the stacked OLED will be reabsorbed by the PD layer.

The OLED coupled to a photodiode has at least two individual OLED light-emitting units (stacks) that are separated by a charge-generation layer (CGL). Thus, at a minimum, the stacked OLED has a first light-emitting unit/CGL/second light-emitting unit (also referred to as a "two-stack" or tandem structure). An OLED stack (an individual light-emitting unit) is always separated from another stack by a CGL. If there is no CGL present, it has a "one stack" structure, even though it may have more than one light-emitting layer that makes up the single stack. In other words, to be considered an OLED light-emitting unit or stack, it must be separated from another light-generating unit by a CGL; however, it is not necessary for a light-generating unit to have an adjacent CGL on both sides. The OLED light-generating units on the top and bottom of the stack will generally have only one adjacent CGL. There is typically no need to use a CGL between a light-emitting unit and one of the top or bottom electrodes, although a CGL could be used if desired. Within the stacked OLED, the individual OLED light-emitting units can be placed in any order between the top and bottom electrodes.

In order to minimize increases in the required threshold voltage (Vth) to drive multiple OLED units (stacks), charge generation layers (CGLs; sometimes also referred to as connector or intermediate layers) are located between the individual OLED light-emitting units or stacks. This is because the CGLs are structured so that electrons and holes are generated upon voltage application, and injected to the adjacent organic emissive layers. Hence, the use of a CGL can cause even further amplification of light emission from the OLED units since the CGL can generate additional electron-hole pairs from the charge due to the photocurrent generated by the PD. In particular, the use of multiple OLED units within the stacked OLED provides an increased ability to provide high light emission while the intermediate CGL between the units further amplifies the photocurrent provided by irradiation of the PD. In this way, emission can be maximized even from a small photocurrent from the PD.

Many different kinds of CGLs have been proposed and may be used in the OLED stack. For example, see U.S. Pat. No. 7,728,517 and US 2007/0046189. For the formation of a CGL, an n-p semiconductor heterojunction, which is located at the interface of n-type and p-type layers, is typically needed for the charge generation and creation of electron-hole pairs. Thus, CGLs will have two or more layers. For example, n-doped organic layer/transparent conductive layer, n-doped organic layer/insulating material, n-doped organic material layer/metal oxide layer, and n-doped organic material layer/p-doped organic material layer have all been reported. A desirable metal oxide for CGLs is $MoO_3$. In some instances, the n-layer and p-layer may be separated by a thin intermediate layer. Often, the CGL is arranged so that the n-layer is closer to the anode and the p-layer is closer to the cathode.

One desirable formulation for a CGL has three layers; an electron-transport material doped with a n-dopant (for example, Li), a thin intermediate layer of the same (but undoped) electron-transport material, and a hole-transport material doped with a p-dopant. Suitable electron-transport and hole-transport materials, along with n-dopants and p-dopants suitable for use in a CGLs are well-known and commonly used. The materials may be organic or inorganic. The choice of appropriate materials is not critical and any may be selected based on their performance. The thickness of the CGL should desirably be in the range of 200-450 Å. In many instances, the CGL will have an ETL on the anode side and an HTL on its cathode side to help improve charge transport and help separate the charge-generating dopants (if present) from the LEL in the light-emitting units.

The CGL is not light-sensitive. It creates electron-hole pairs due to an electrical field created between the OLED electrodes and not from light generated from the surrounding OLED light-emitting units. It is different from a photodiode layer.

The number of individual OLED light-emitting units or stacks within the OLED amplification unit is limited only by the overall thickness of the OLED. As the number of OLED units increase, the total amount of light emitted increases, but the thickness of the package and the complexity of the manufacturing process increase as well. Typically, the amount of increased emission by adding another stack may decrease somewhat as the number of stacks is increased. That is, 2 stacks may have 2× the emission of a 1 stack device, but a 3-stack device may only have 2.8× the emission of a 1 stack device. The threshold voltage also generally increases linearly with the number of individual OLED stacks.

It is contemplated for the stacked OLED to include at least two OLED stacks separated by a CGL. An OLED coupled with the PD with at least three OLED light-emitting units (and two CGLs) will provide increased luminance over a tandem (two OLED units/one CGL) stacked OLED. However, OLED amplification units with at least four OLED light-emitting units (and three CGLs) can be more desirable. Even as many as ten or more OLED light-emitting units (with n−1 CGLs) can be useful. The minimum number of stacks required will be determined by the minimum number that will facilitate avalanche mode operation and the self-amplifying feedback loop.

Stacked OLEDs with multiple light-emitting units can have very high emission. For example, the stacked OLEDs can easily generate 100-10,000 nits of light, especially green. This may generate more light than the user may need (e.g. 10× to 1000×) for some applications. Some night vision applications only require 1-10 nits at peak emission brightness, so the choice regarding the number of OLED stacks necessary is dependent on the design requirement of the device.

FIG. 1 is a schematic cross-section of one example of an optical upconverter 100. On a transparent substrate 101 is located a photodetector (PD) layer 103 coupled to a stack of organic light emitting diodes (OLED) 107 (or a stacked OLED 107) through a transparent connector (or connecting layer) 105. Stacked OLED structure 107 comprises a first light-emitting unit 109, a CGL 111 and a second light-emitting unit 113. Over the stacked OLED 107 is a transparent top conductive layer 119 and a top layer 115. The PD 103 is exposed to an input light 120 which generates a photocurrent 130 within the PD 103. The photocurrent then passes through connector 105 to cause output emission 140 from the light-emitting units 109 and 113 that is augmented by the presence of the CGL 111. A current pathway between transparent conductive layer (acting as the top electrode) 119 and PD 103 (acting as the bottom electrode for the OLED structure 107) is established via an electrical connection 121. Alternatively, electrical connection 121 may simply connect 119 to ground or to a controlled voltage source instead of the PD 103. Since the output emission 140 from light-emitting units 109 and 113 is non-directional, the emission can travel through the top layers 119, 115 as well as travel through connector 105 to impinge upon PD 103.

Since PD 103 is a photodiode, if there is no input light 120, no photocurrent is generated and there is no emission from the stacked OLED 107. Input light 120 incident upon the PD 103 causes the PD 103 to generate photocurrent flow through the stacked OLED 107 to cause emission. More particularly, the presence of input light 120 being incident upon the PD 103 causes the PD 103 to generate an electron-hole pair (called charge carriers). Transfer of charge carriers through the connector 105 causes any one or combination of the light-emitting stacks (i.e., 109, 113) within OLED 107 to generate photons resulting in output emission 140. Because OLED 107 is coupled to PD 103, at least one photon generated by the stacked OLED 107 can be absorbed (or re-absorbed) by the PD 103. Any one or combination of absorbed (or re-absorbed) photon can generate an additional electron-hole pair within the PD 103. The additional electron-hole pair can cause the stacked OLED 107 to generate additional photon(s) resulting in an increase in the emission output 140, within the second frequency band, thus forming a self-amplifying feedback loop (avalanche mode).

Thus, the photocurrent 130 generated by the exposure of PD 103 by input light 120 drives the stacked OLED 107, and particularly causes the stacked OLED 107, augmented by the CGL 111 which provides increased electron-hole pair generation, to operate in avalanche mode. In this embodiment, all the charge carriers that flow through the OLED 107 are generated by the PD 103.

The optical upconverter 100 is intended to convert a band of light (input light 120) from a lower frequency to a band of light of a higher frequency (output emission 140). Electrical circuit 121 can be used to supply the additional energy needed to upconvert light of a lower frequency to one of a higher frequency if needed. Thus, the PD 103 can be configured to operate with light that falls within a first frequency band. The stacked OLED 107 can be configured to generate light that falls within a second frequency band. Light within the first frequency band incident upon the PD 103 causes it to generate the photocurrent 130. The photocurrent 130 is directed to the stacked OLED 107 and causes the OLED 107 to generate light within the second frequency band. The light within the first frequency band is within a frequency range that is lower than the frequency range of the light in the second frequency band. The PD is also sensitive to the second frequency band.

Exemplary embodiments relate to use of the optical upconverter 100 to convert infrared (IR) or near-IR (NIR) light to visible light. This can have applications for night vision systems. Thus, the first frequency band (input light 120) can include frequencies within a range from 300 GHz to 400 THz; i.e., the PD 103 generates photocurrent 130 when light within 300 GHz to 400 THz is incident upon it. The second frequency band (output emission 140) can include frequencies within a range from 400 THz to 790 THz; i.e., the stacked OLED generates lights within 400 THz to 790 THz when photocurrent from the PD 103 is directed to it. Thus, the IR light can be effectively and efficiently converted to visible light in some embodiments.

Figure 2:
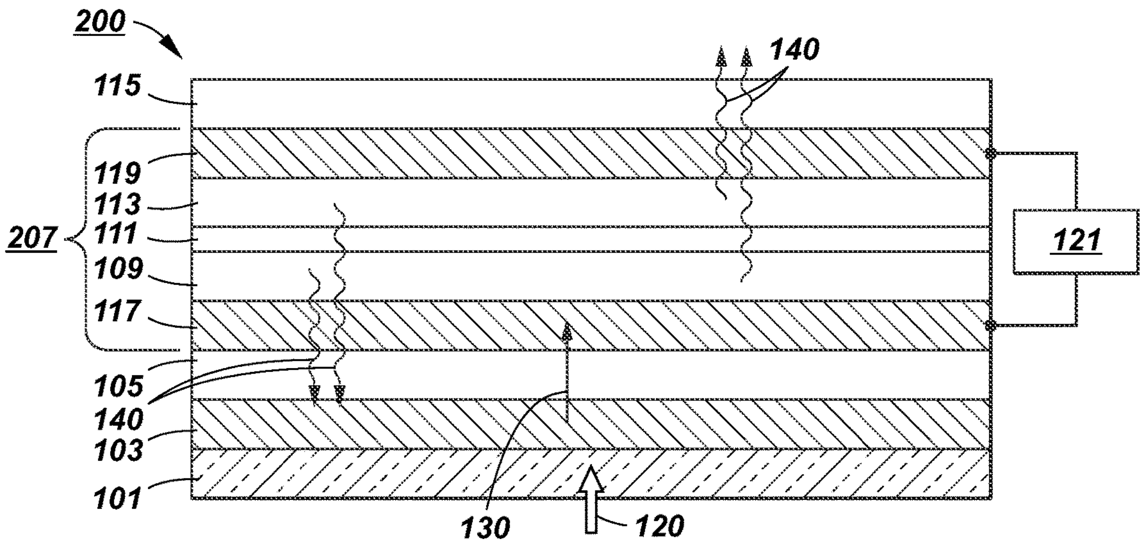
FIG. 2 shows a schematic cross-section view of 200, which is a second embodiment of the invention.

FIG. 2 is a schematic cross-section of another example of an optical upconverter 200. It is similar to 100 but the stacked OLED 207 includes a bottom electrode 117 and a top electrode 119 which are connected to a power source 121. In this embodiment, both electrodes 117 and 119 are transparent. The PD 103 is located between the bottom electrode 117 of the stacked OLED 107 and the substrate 101 and not between the electrodes 117 and 119. This embodiment operates as 100 except that the photocurrent 130 generated by light exposure of PD 103 energizes the bottom electrode 117 instead of the light-emitting units 109 and 113. The voltage according to photocurrent 130 then causes current to flow between the electrodes 117, 119 and the light-emitting units between the electrodes will then emit light 140. Re-absorption of at least some of the light 140 emitted by the stacked OLED by the PD will result in the generation of additional electron-hole pairs which increases the photocurrent generated by the PD, resulting in additional emission by the stacked OLED and additional amounts of re-absorption of the OLED emitted light by the PD and so forth, resulting in the device operating in an avalanche mode. The end result is greatly amplified emission by the OLED based on the amount of inputted light.

One advantage of this embodiment is that a constant voltage, set below the threshold voltage (Vth) of the stacked OLED 207, can be applied to electrodes 117, 119 via 121. When PD 103 generates photocurrent 130, its voltage is added to the constant voltage supplied by power source 121 so that total voltage available meets or exceeds the threshold voltage (Vth) of OLED 207. In this way, it is not necessary that photocurrent 130 is sufficient to completely drive stacked OLED 207 by itself and can be augmented by the power supplied by power source 121. It is important to note that the power supplied by power source 121 is constant and independent of the light input to PD 103 that results in photocurrent 130. Another advantage is that the power source 121 can be used to reset or zero-out 200 by applying a reverse bias to stacked OLED 207.

The Vth of a stacked OLED is linearly related to the number of OLED stacks (units). For example, if a single stack OLED has a Vth1, two of the same stacks (separated by one CGL) will have a Vth2 that is roughly 2×Vth1 and three stacks (with 2 CGLs) will have a Vth3 that is roughly 3×Vth1, etc. Having a higher Vth with multiple stacks is a further advantage in stacked OLEDs since the constant bias applied to OLED electrodes can be set at a higher level without causing the stacked OLED to emit. The result is that avalanche mode can be initiated even by a low level of photocurrent from the PD since the bias applied to the electrodes is higher.

In some cases, the threshold voltage ($V_{th}$) of the OLED stack can be estimated by linear extrapolation of the I-V curve, after significant light emission begins, back to the voltage axis. Because this method is not exact because I-V response curves for OLEDs may not be completely linear over their response ranges, values calculated in this manner are not exact. A general range for this metric is +/−10%. More accurately, the threshold voltage can be defined as the voltage where the current density is no more than 0.2 $mA/cm^2$ of the exposed anode layer, and there is at least some reliable detectable luminance; that is, at least 5 cd/A.

Figure 3:
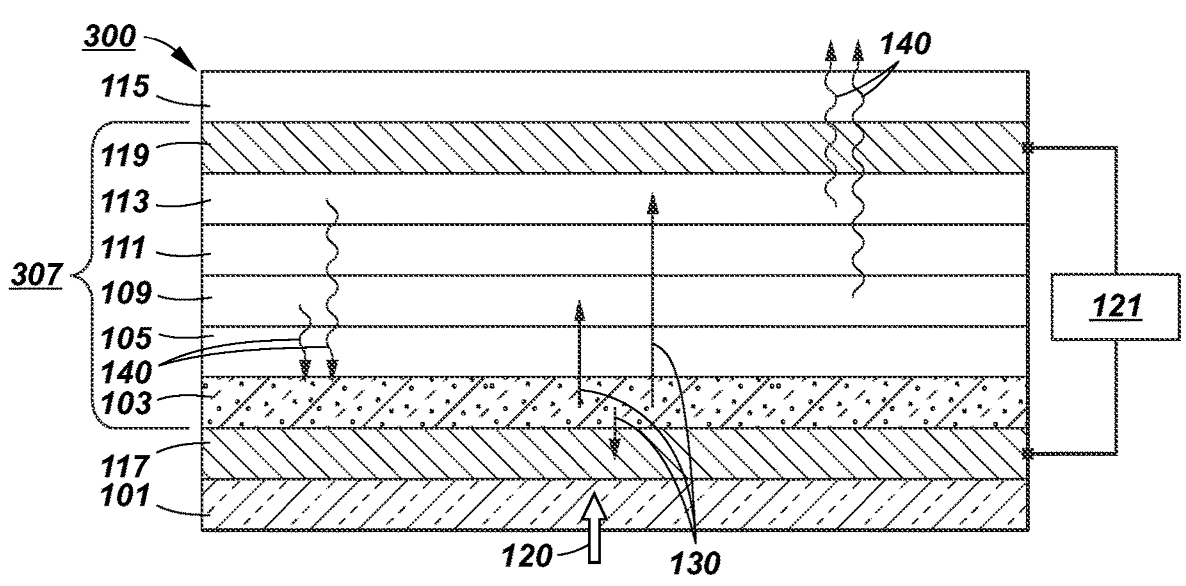
FIG. 3 shows a schematic cross-section view of 300, which is a third embodiment of the invention.

FIG. 3 is a schematic cross-section of another example of an optical upconverter 300. It is similar to 100 and 200 but the stacked OLED 307 includes a transparent bottom electrode 117 and a transparent top electrode 119 which are connected to a power source 121 where the PD 103 is located between the electrodes 117 and 119. In this embodiment the PD 103 is located between the electrodes of the stacked OLED 307 and should be considered as an integral part of 307. This embodiment operates as 100 and 200 except that the photocurrent 130 generated by light exposure of PD 103 directly controls the current to the light-emitting units 109 and 113. Desirably, the PD 103 should be located between the light-emitting unit (for example, 109) closest to the bottom electrode and the bottom electrode (for example, 117). Most desirably, there is an electron-injection layer (EIL) between the PD and the bottom electrode.

The embodiment illustrated in 300 where the PD is located between the electrodes of the OLED is the most preferred. Ideally where IQE (internal quantum efficiency) is 100%, each photon of input light 120 generates an electron-hole pair in the PD 103, which are pulled apart by the applied field between the OLED electrodes. The separated charges can migrate to the stacked OLED to generate one (or more) photon per stack. Subsequent reabsorption of the emitted OLED light 140 by the PD 103 will eventually lead to an avalanche situation and amplification of the original.

A constant voltage can be applied across electrodes 117 and 119 by power source 121. Desirably, the constant voltage is below the threshold voltage Vth of the OLED for at least part of the time of the duty cycle so that there is no emission caused by the applied voltage alone. When PD 103 generates photocurrent 130 upon exposure, PD 103 becomes conductive and current flows through the OLED 307 resulting in emission from the OLED. Alternatively, power source 121 can be used to generate light from the OLED 307 independent of any input exposure of PD 103.

The substrate 101 of the optical upconverter should be transparent to at least one wavelength of the light to which the PD is sensitive in order to create a photocurrent. It may be opaque to other wavelengths of light to which the PD is sensitive. Desirably, the substrate is glass (including flexible glass) or organic polymeric materials. Generally speaking, it will be flat with a uniform thickness. The top surface of the substrate is that facing the stacked OLED. Since the substrate will be part of the overall encapsulation for the OLED, it should be sufficiently impervious to air and water so that the OLED will have desired lifetime. The substrate can be rigid or flexible. The substrate may have various types of subbing layers (i.e., planarization layers, light management layers, etc.) which may be patterned or un-patterned and can be either on the top or bottom surfaces. Desirably, the input light to which the PD is sensitive passes through the substrate. It may be opaque or reflective to the light generated by the stacked OLED.

In some desired embodiments, the upconverter contains a photodiode (PD) (equivalently, a photoconductor or photosensor) layer (i.e., 103). The PD is located above the substrate. It may be located either between the bottom electrode of the stacked OLED and the substrate or between the top and bottom electrodes of the stacked OLED. A photodiode is a light-sensitive semiconductor diode. It produces current when it absorbs photons. A photodiode can use a PIN junction or a p-n junction, to increase the speed of response. Photodiodes usually have a slower response time as their surface area increases. When a photon of sufficient energy strikes the photodiode, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus, holes move in one direction and electrons in another direction and a photocurrent is produced.

The PD can be reverse biased. In this case, the electron-hole pair are separated by an externally applied electric field. For example, in device 300, the PD can be reverse biased and the OLED is forward biased by the charge applied to the top and bottom electrode. A reverse biased PD can have dark current (current that is generated in the absence of light) as well as the photocurrent, so the dark current must be minimized to maximize the sensitivity of the device.

Photoconductivity is an optical and electrical phenomenon in which a material becomes more electrically conductive due to the absorption of electromagnetic radiation such as visible light, ultraviolet light, infrared light, or gamma radiation. Photodetectors, also called photosensors, are sensors of light or other electromagnetic radiation. When light is absorbed by a photodiode, the number of free electrons and holes increases, resulting in increased electrical conductivity. To cause excitation, the light that strikes the semiconductor must have enough energy to raise electrons across the band gap, or to excite the impurities within the band gap. To a first order for a given spectral distribution, the photocurrent is linearly proportional to the irradiance.

The PD is a flat layer located underneath or within the electrodes of the stacked OLED and is not located laterally to the stacked OLED. It is not located outside the encapsulation of the stacked OLED. When exposed to external input light (i.e., 120) through the substrate (and opposite to the light emitted from the stacked OLED), the photodiode layer generates, in proportion to the amount of light input, either a current sufficient to cause emission from the OLED stacks, or becomes electrically conductive enough, in the presence of a separate electric field, to pass current into the OLED stacks so that light is emitted. In embodiments where the OLED stacks are located between two electrodes that supply power, the internal photodiode layer can be located between the two electrodes of the OLED stacks and may be present between any of the OLED layers. Desirably, it is located between the lowest or bottom-most OLED stack and the bottom electrode and more desirably, there is a non-light emitting layer such as a carrier injection layer (EIL or HIL) between the PD and the bottom electrode. In some embodiments, the PD can be located directly adjacent to the bottom electrode. In some embodiments where there is only one electrode associated with the OLED stack, the photodiode layer is desirably located between the connection layer and the substrate.

"Coupled" means there is electrical interaction and transfer between a PD layer (or a connection layer) and an overlying stacked OLED. In embodiments where the PD is located outside the electrodes of the stacked OLED, "fully coupled" means the PD layer and the layers of stacked OLED are congruent and have approximately the same area. "Partially coupled" means the PD layer and the layers of the stacked OLED are offset from each and do not overlap completely. "Decoupled" means the PD layer and the layers of the stacked OLED are separate from each other and there is no electrical interaction. In embodiments where the PD is internal to the stacked OLED, they are always fully coupled.

The PD can be an inorganic PD or an organic PD. The material used to make a photodiode is critical to defining its properties, because only photons with sufficient energy to excite electrons across the material's bandgap will produce significant photocurrents. Known inorganic PDs include Silicon, Germanium, Gallium Nitride, Indium gallium arsenide, Lead (II) sulfide and Mercury cadmium telluride. Organic photodiode (OPD) materials are well known; preferred are fullerenes such as C60 and C70 or phthalocyanines such as aluminum chlorophthalocyanine (ClAlPc). ClAlPc is a well-known photodiode material used in organic photovoltaic devices. ClAlPc absorbs in the near-IR region and fluoresces around 650 nm (for example, see Hadiyanto et al, "Transparent photodetectors with ultra-low dark current and high photoresponse for near-infrared detection", Organic Electronics, 99, 106356 (2021)). Such organic photodiode materials (often referred to as a donor) can be used in combination with a host material (often referred to as an acceptor). Often one material with the desired bandgap is used to absorb the photon and generate the electron-hole pair. A second material is often used to assist in the separation of the charges and the conduction of the charges. The materials can be in separate layers or mixed together. Organic PD materials are preferred.

When the PD needs to be sensitive to a wide range of wavelength of light or two or more separate regions of light, a combination of two (or more) photodiode materials may be used, either as an admixture or in separate layers. For example, a PD layer may be composed of one PD material that is sensitive to IR or NIR light (i.e., input light 120) along with a second photodiode material that is sensitive to light that is emitted by the stacked OLED (i.e., emission light 140). A third host or acceptor material may be present as well. A mixture of a fullerene and a phthalocyanine is preferred as a PD for absorption in the NIR (input light) as well as visible light from the stacked OLED.

In some embodiments, the PD layer may be patterned. In some embodiments, the PD is patterned so that it is still a single layer but is designed so that it does not cover the entire surface of the substrate. In other embodiments, the PD may be patterned into individual segments that are electrically isolated from each other. This is particularly desirable for pixelated display devices. For example, the PD can be patterned into a striped or a checkerboard design. In some embodiments, different segments of the PD may have a different formulation from other PD segments.

In some embodiments, a transparent connector or connecting layer may be present between the PD layer and the stacked OLED (for example, connector 105 in 100). The connector couples the PD layer to the overlying stacked OLED so that the passage of the photocurrent generated by the PD layer is facilitated through the connector to the stacked OLED. Thus, the connector should be made of a conductive material or at least, thin enough as not to excessively hinder transfer of the photocurrent. Desirably, the connector material will have low lateral conductivity in order to prevent lateral flow of the charges to prevent intermixing between lighted and non-lighted areas. Lateral conductivity can be prevented via physical structures (insulating dividers, etc.) or minimized via use of materials with inherently low lateral conductivity. Moreover, since light generated by the stacked OLED should pass through the connector to the PD layer in order to create an avalanche effect, the connector should be transparent to the light emitted from the stacked OLED. However, it is not necessary that the connector be transparent to the input light (i.e., 120) to which the PD is sensitive and originates the avalanche effect. For example, if the PD is sensitive to both IR light and green light and the stacked OLED emits primarily green light, the connector may be transparent to green light but not IR light. In this example, the substrate would be transparent to IR light but not necessarily G light.

It is also important that the connector not cause any light scattering. This can be achieved via using an index of refraction (RI) matching material (e.g., fluid, gel, adhesive, etc.) disposed between the PD and the stacked OLED. It would be desirable that the refraction index (RI) of the connection layer be matched as close as possible to the layers immediately adjacent to its top and bottom surfaces. By 'matched', it is meant that the differences in RI between connection layer and its adjacent layers are as small as possible. If possible, the RI of connection layer should be intermediate between the RI of the two adjacent layers. The selection of the index of refraction material can be such that the feedback factor, $f>0.9$. Preferably, the selection of the index of refraction material can be such that the feedback factor, $f>1.0$. The feedback factor (f) is defined as the probability that an electron transiting the OLED will lead to emission of a photon that is re-absorbed by the PD and converted to photocurrent. Under most conditions, it should be less than 1; however, due to the added contribution of the stacked OLED, it can be greater than 1.

Some examples of suitable materials for the connector include OLED charge transport type materials such as hole-transfer materials or electron-transport materials. A suitable material is NPB. In some embodiments, the connector can be composed of transparent conductive inorganic materials such as metal oxides (i.e., ITO or AZO) or a thin (<10 nm) layer of conductive metal such as Ag or Au. The conducting layer can help to transport the photocurrent 130 to the light-emitting units within the stacked OLED. If desired, the conductor layer can be electrically externally connected as to maintain a constant bias. However, in embodiments such as 100, 105 does not serve as a bottom electrode for the stacked OLED. However, in other embodiments such as 200 where the stacked OLED includes a bottom electrode (i.e., 117), the bottom electrode and the connector may be combined into a single layer if desired. There may be additional layers located over the connection layer in order to modify its properties or provide protection to the underlying layers during manufacture.

In some embodiments, the emission from the stacked OLED may be independent of the location where the input light impinges on the PD. That is, even though the input light to the PD may only be applied in one area, the light emitted from the stacked OLED may be in a different location or even uniformly spread over the entire front surface of the upconverter. In other embodiments, it is desirable that the emission of the stacked OLED is correlated with the location of the input light. That is, if the input light is restricted to a single area of the PD, emission from the stacked OLED only occurs directly above the location of the input light.

In particular, the upconverter can be arranged to generate an optical pixel, or at least be a component used to generate an optical pixel. Optical pixels can be used in a pixelated display with more than one optical pixel arranged in an array. The display can be a display for a night vision optical system. Thus, the substrate can be a lens (e.g., camera lens).

There are two basic approaches to making a suitable stacked OLED where its emission would correlate with the location of the input light, thus forming an optical pixel, so that the upconverter could operate as an amplified display of the input light. In such displays, the PD would desirably be patterned into segments. The first approach involves having the stacks form individual pixels. In this approach, the photocurrent from an activated PD segment is transferred to an individual overlying pixel so that input light in one part of the PD generates light from the stacked OLED only in that individual pixel. Light emitted from the OLED stacks can then further cause the PD to generate additional photocurrent resulting in an avalanche mode within the pixel. The second approach is where the OLED stacks have common layers across all pixels and are used with a color filter array (CFA) in order to produce individual pixels. The second approach has an advantage over the first in that it is not necessary to create individual OLED pixels of different formulations and so, manufacturing costs and complexity will be reduced.

Figure 4:
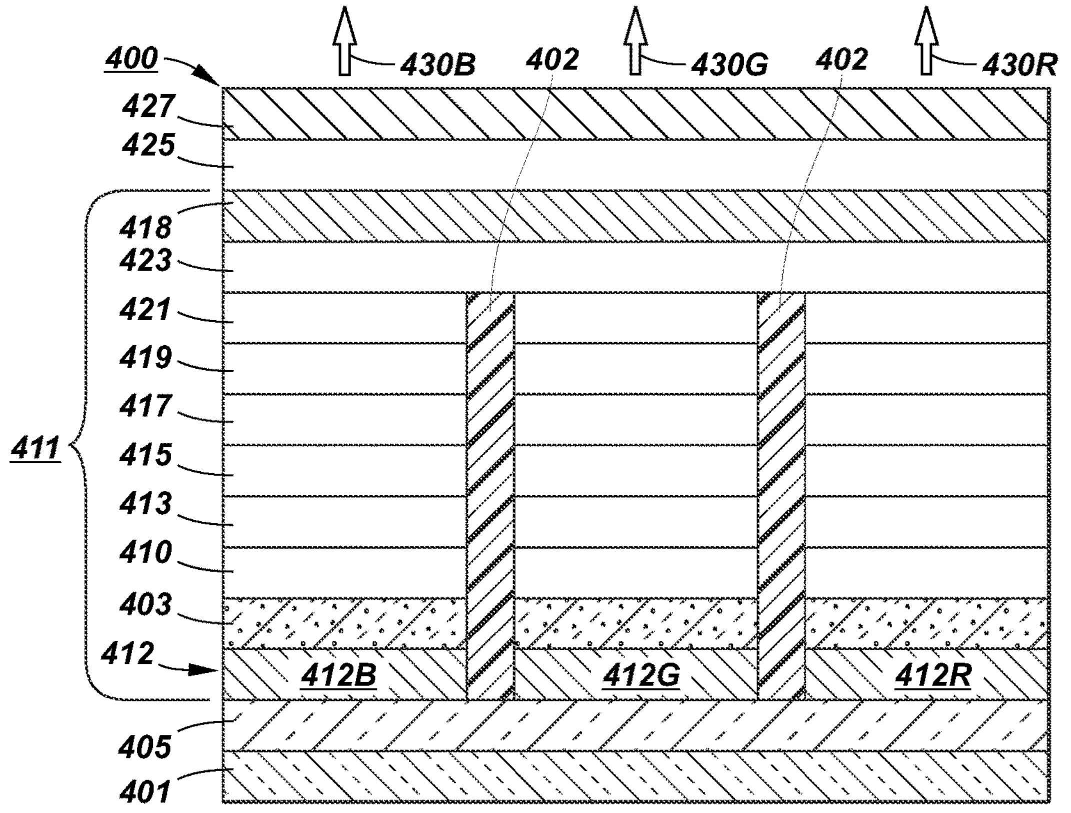
FIG. 4 shows a schematic cross-section view of a three-stack OLED 400 where the layers of the stacks are divided into pixel segments.

FIG. 4 illustrates one embodiment of a suitable three stack OLED upconverter 400 that uses three different OLED stacks 411 to create R, G and B pixels 430B, 430G, 430R. Each OLED stack 411 contains three OLED light-emitting units 413, 417, 421 that emit the same color in which each unit is vertically separated from another unit by a CGL 415, 419. Since this embodiment emits RGB light, it would be desirable that the PD is sensitive to at least one of these colors of light as well as IR or NIR light (which would be the input light). Ideally, the PD is patterned into segments which are at least partially "false colored"; that is, the input light (i.e., 120) is different from the light emitted from the stacked OLED.

Three stack OLED 411 would be located over a substrate 401 and optional transparent connector layer 405. Over 405, there are transparent first electrode segments 412B, 412G, 412R that are separated by an electrically insulating material (pixel definition layer) 402. Over the bottom electrode segments are PD layer segments 403. Over 403, there are non-light-emitting OLED layers 410, such as electron- or hole-injection (EIL or HIL) or electron- or hole-transport (ETL or HTL) layers. A first light-emitting OLED unit 413 is over OLED layers 410. Layer 415 is a charge-generation layer which lies between and separates the first light-emitting unit 413 and a second light-emitting OLED unit 417. Over the second light-emitting OLED unit 417, there is a second charge-generation layer 419 that lies between and separates the second light-emitting OLED unit 417 and a third light-emitting OLED unit 421. Over the third light-emitting unit 421 are nonlight-emitting OLED layers 423, such as electron- or hole-transport layers or electron- or hole-injection layers, and transparent top electrode 418 through which light can be transmitted. Over 418 is an optional top layer 425. OLED 411 is protected from the environment by an encapsulation layer 427. Encapsulation layer 427 may act as the uppermost layer or surface of the integrated device, or alternately top layer 425 may be present over the encapsulation 427. In the embodiment shown, all the layers between the bottom electrode segments 412B, 412G, 412R and OLED layer 423 within a single OLED stack are separated horizontally from the adjacent stack by a pixel definition layer 402. The top electrode 418, optional top layer 425 and the encapsulation 427 are in common and extend across the entire active area. However, the top electrode 418 and optional top layer 425 need not be continuous and can be segmented if desired.

In 411, each vertically stacked segment of the OLED light-emitting units 413, 417, 421 above the bottom electrode segment 412B, 412G, 412R emits the same color of light, either B, G or R. For example, all of the OLED units above 412B form a pixel 430B that emits B light, all of the OLED units above 412G form a pixel 430G that emits G light and all of the OLED units above 412R form a pixel 430R that emits R light. Alternatively, OLED unit 413 can emit one color of light (i.e., B) in each of the stacks above 412B, 412G, 412R, while 417 can emit another (i.e., G) in each stack and 421 can emit a third color (i.e., R) in each of the stacks. In this way, all of the stacked OLEDs emit the same color of light (i.e., all pixels emit W) and colored pixels can be formed by using the appropriate color filters in the light path. It is also possible that all of the OLED units (and the resulting pixels) emit the same color so that the display is monochromatic.

Upon irradiation of the PD layer 403 in 411, a photocurrent is generated by the PD segments 403 can be transferred to the bottom electrode segment or directly to the overlying OLED stacks. Photocurrent then causes the overlying stacked OLEDs 411 to emit light in a pixelated form.

It is also possible to use a common bottom electrode in 400. Since the photocurrent can be laterally spread through the bottom electrode, the location of the emission from the overlying stacked OLEDs will not necessarily correlate with the location of the input light.

While stacked OLED 411 is not a microcavity device, it can be modified to use a microcavity effect to further maximize its emission. It is also possible to locate a PD between the bottom electrode segments and the substrate (as in 200). For example, electrically isolated (by 402) segments of the PD can be located between the bottom electrode segments 412B, 412G, 412R and the common substrate. The connecting layer 405 may be segmented or not as desired.

Figures 5, 6:
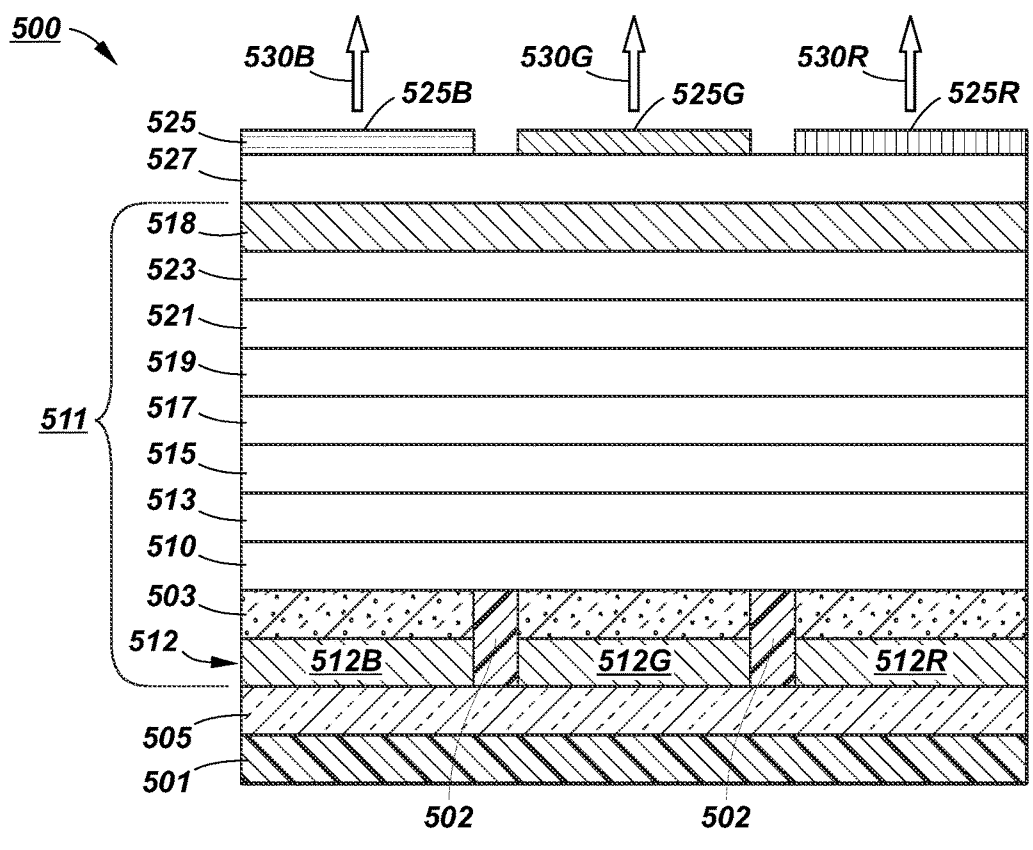
FIG. 5 shows a schematic cross-section view of a three-stack OLED 500 where the layers of the stacks are common across pixel segments.
FIG. 6 shows a schematic cross-section view of 600 where the pixel segments are defined by optical dividers.

FIG. 5 illustrates one embodiment of a suitable three stack OLED upconverter 500 that uses a three-stack multimodal (white) OLED structure (511) that is common across all pixels together with a color filter array (CFA) to create R, G, and B pixels (530B, 530G, 530R). A multimodal OLED produces more than one color of light. Ideally, a multimodal OLED produces a white light with roughly equal amounts of R, G and B light. Typically, this would correspond to $CIE_x$, $CIE_y$ values of approximately 0.33, 0.33. However, some variation from these values is still acceptable or even desirable depending on the characteristics of the color filters used to create RGB pixels. In this embodiment, the multimodal OLED stack contains three OLED light-emitting units that emit different colors in which each unit is vertically separated from another unit by a CGL. The stacked OLED of this embodiment emits RGB (W) light and it would be desirable that the PD be sensitive to at least one color of light emitted by the stacked OLED as well as IR or NIR light.

Three stack OLED 511 would be located over a substrate 501 and optional transparent connector layer 505. Over 505, there are transparent first electrode segments 512B, 512G, 512R that are separated by an electrically insulating material (pixel definition layer) 502. Over the bottom electrode segments are PD layer segments 503. Over 503, there are non-light-emitting OLED layers 510, such as electron- or hole-injection (EIL or HIL) or electron- or hole-transport (ETL or HTL) layers. A red OLED light-generating unit 513 is over OLED layers 510. Layer 515 is a first charge-generation layer which lies between and separates the red OLED light-generating unit 513 and a green OLED light-generating unit 517. Over the green light-emitting unit 517, there is a second charge-generation layer 519 that lies between and separates the green OLED light-generating unit 517 and a blue OLED light-generating unit 521. Over the blue OLED light-generating unit 521 are nonlight-emitting OLED layers 523, such as electron- or hole-transport layers or electron- or hole-injection layers, and transparent top (second) electrode 518. There is a power source 121 (not shown) between 512B, 512G, 512R and 518. The stacked OLED 511 is protected from the environment by an encapsulation layer 527.

Over 527, there is a top layer 525 which contains a color filter array with color filters 525B, 525G and 525R which filter the multimodal emission generated by the OLED 511, thus forming colored pixels 530B (emits B light), 530G (emits G light), 530R (emits R light) according to the photocurrent from the activation of the photodiode.

The bottom electrode of 511 might be continuous. The emission from the stacked OLED 511 can be arranged to be monochromatic where all light-emitting units emit the same color. It is also possible to locate a PD between the bottom electrode segments and the substrate. For example, electrically isolated segments of the PD 503 can be located between the bottom electrode segments 512B, 512G, 512R and 501, preferably between 505 and the electrode segments 512. While 511 is not a microcavity device, it can be modified to use a microcavity effect to further maximize its emission.

In upconverter devices), the bottom electrode segments can be an anode or a cathode and are transparent. Preferably, the bottom electrode can be made of transparent metal oxides (ITO or AZO preferred) having a thickness of at least 30 nm, desirably at least 60 nm, or thin transparent metals such as Al, Au, Ag (preferred) or Mg or alloys thereof having a thickness of no more than 20 nm, desirably no more than 10 nm. Desirably, the bottom electrode is a transparent anode preferably having a transmittance of at least 70% or more desirably at least 80%. While most OLED devices have the anode side on the substrate, it is possible to invert the layer order so that the cathode side of the device is on the substrate.

The electrodes of the stacked OLED can be continuous layers if they are not used in terms of the image signal but rather simply used to apply a common bias across the entire unit. Alternatively, in some applications, one or both electrode layers may be patterned so that the bias is applied to some areas but not others or operated as a display independent of any activation of the PD by light.

Electron-transport and hole-transport materials suitable for use in non-emitting layers such as hole-injection layers (typically located adjacent to an electrode), hole-transport layers or electron-injection layer or electron-transport layers are well-known and commonly used. These layers may be mixtures of such materials and may contain dopants to modify their properties. Since they are non-light emitting, they do not contain emitting materials and are transparent. The choice of appropriate materials is not critical and any may be selected based on their performance. ETMs and HTMs can also be used as a connector (i.e., 105).

Light-emitting layers typically have a host material (or a mixture of host materials), which is the primary component of the layer, and a light-emitting compound. Desirably, the light-emitting compounds are phosphorescent as these have higher efficiency. However, in some instances, some LELs may use fluorescent or TADF (thermally activated delayed fluorescent) compounds as materials for light emission while others use phosphorescent materials. In particular, the blue light-emitting OLED layers may use fluorescent or TADF compounds or combinations thereof while non-blue light-emitting layers may use green, yellow, orange or red phosphorescent compounds or combinations thereof. Light-emitting layers may use combinations of light-emitting materials. The choice of appropriate materials for LELs is well known, is not critical, and any may be selected based on their performance and emission characteristics. When using fluorescent or phosphorescent emitters, it is sometimes necessary to confine the excitons generated by the phosphorescent emitter within the layer. Thus, exciton-blocking layers on either side, or both, of the phosphorescent LEL can be used if necessary. Such materials and their application are well known.

When present, the top electrode of the stacked OLED is transparent and composed of the same materials as the bottom electrode. A thickness of the upper electrode layer is desirably 50-200 Å, and more desirably 125-175 Å. In some embodiments, a thicker top electrode (200-500 Å) can be desirable. While this may decrease light transmission to some degree, it may allow extra photons to recycle back to the PD for faster response time.

There may be protective or spacing layers over the upper electrode to prevent damage during encapsulation or during further manufacturing operations.

Over the top electrode and any optional protective layers, if present, is deposited or placed encapsulation which can in some embodiments can also serve as the top layer. At a minimum, the encapsulation should fully cover the light-emitting area on the top and sides and is in direct contact with the substrate. The encapsulation should be impervious to air and water penetration. It is transparent. It should not be electrically conductive. It may be formed in-situ or added as a separate pre-formed sheet along with provisions for sealing the side edges. An example of in-situ formation would be thin-film encapsulation. Thin-film encapsulation involves the deposition of multiple layers with alternative layers of inorganic materials and polymeric layers until the desired degree of protection is achieved. Formulations and methods to form thin-film encapsulation are well known and any can be used as desired. Alternatively, encapsulation may be provided using a pre-formed sheet or cover slip which is attached over at least the enclosed area that requires encapsulation. The pre-formed sheet may be rigid or flexible. It could be made of glass (including flexible glass), metal or organic/inorganic barrier layers. It should have a thermal expansion coefficient that is close to the substrate to achieve a more robust connection. Pre-formed encapsulation sheets may need to be attached over the sealing area using air and water-proof adhesives such as silicone or epoxy adhesives or by thermal means such as ultrasonic welding or glass frit welding, which may require additional sealants such as solder or glass frit. The side and bottom edges of the cover slip can be specially designed to have better fit to the sealing area or promote a better seal. The cover slip and sealing area may be designed together so that they fit or lock partially in place before the seal is formed. Moreover, the cover slip may be pretreated to promote better adhesion to the sealing area.

However, since the top surface (including the encapsulation) of the upconverter must be transparent to visible light, it is possible that external light from the environment can penetrate and activate the internal photodiode layer that is present below or within the stacked OLED. This would cause the system to fail or be less efficient. Moreover, the substrate maybe at least partially transparent to visible light. Hence, the photodiode layer should either not be sensitive to any light that can penetrate through the top layer or substrate or any such light should be blocked from reaching the PD layer. Ideally, the only light that reaches the PD layer is that input light or the light generated by the stacked OLED. If the transparent (to visible light) top layer or encapsulation does not provide sufficient protection against external light to which the photodiode is sensitive, then that protection should be provided at any point above the PD layer. Likewise, if the substrate doesn't provide sufficient protection against undesired wavelengths of light, then such protection may be provided between the substrate and the PD layer. For example, in one embodiment the PD layer can be designed to be sensitive to IR light (as input light) and green light (as light from the stacked OLED) to provide the avalanche effect. In this example, the top layer of the up-converter may include an IR absorbing filter or material so that external IR light does reach the PD while between the substrate and the PD layer is an IR transparent filter layer that blocks green light. If the photodiode layer is sensitive to UV light, then external UV light should be prevented from reaching the photodiode layer.

In particular, the optical upconverter can include a long pass filter adjacent to the substrate. The long pass filter can be configured to block light that falls within the second frequency band and pass light that falls within the first frequency band. For example, the long pass filter can allow IR light to enter but prevent visible light from exiting. The long pass filter will be at the rear face, which is the face receiving the input light 120, so as to allow IR light to enter at the rear face but prevent or inhibit visible light to exit at the rear face.

A Bragg reflector could be included as part of the device. A distributed Bragg reflector (DBR) is a reflector used in waveguides, such as optical fibers. It is a structure formed from multiple layers of alternating materials with varying refractive index, or by periodic variation of some characteristic (such as height) of a dielectric waveguide, resulting in periodic variation in the effective refractive index in the guide. Each layer boundary causes a partial reflection of an optical wave. For waves whose vacuum wavelength is close to four times the optical thickness of the layers, the many reflections combine with constructive interference, and the layers act as a high-quality reflector. The range of wavelengths that are reflected is called the photonic stopband. Within this range of wavelengths, light is “forbidden” to propagate in the structure. For example, it would be desirable that the substrate be coated with a DBR that will transmit the IR light of interest to the PD and reflect the OLED light that is generated from above the PD. This increases the overall efficiency of the device.

The upconverter can emit W light via discrete RGB stacks which may or may not have RGB color filters or W light via common layers which will require color filters. Thus, the color filters may be incorporated as part of the top layer. While the color filters may provide sufficient UV/IR protection alone, the remaining top layer may provide additional protection against external exposure of the photodiode. Desirably, the top layer is continuous, but may be patterned in some embodiments. The top layer may have multiple separate layers.

Some upconverter designs may be prone to cross-talk (XT) where input light is received by the PD in one location but the emission occurs over a broader area than directly above the location of the input light. This is a particular problem in OLED structures since the light within the OLED light-emitting units is emitted in all directions and so, light will be scattered in all directions within the stacked OLED. Escape of light that is generated in one location or pixel but exiting from the device through another location or pixel is undesirable. This problem can be somewhat mitigated through the use of appropriate pixel definition layers or other techniques to prevent light from escaping from the pixel where it is generated. The use of multimodal microcavity OLED stacks with common layers also increases the problem because of lateral carrier migration. All OLED layers, including any connectors through which photocurrent passes should have sufficiently low lateral resistance to prevent XT, or must be divided/patterned into segments so that lateral current cannot occur. In some instances, significant pixel cross-talk problems can still exist and techniques and methods to further reduce the cross-talk are useful in combination with upconverter can be useful.

FIG. 6 illustrates one solution to the problem of cross-talk. Up-converter 600 is a pixelated device so that the emission produced by the stacked OLED is restricted to the same location where the PD is exposed to the input light 120. On a substrate 601 is a PD layer 603 which has pixel locations 632, 652 and 672. PD layer 603 may be a continuous layer (as shown) or there may electrically insulating dividers between the pixel locations 632, 652, 672 (not shown). Dividing the PD layer into segments may prevent lateral migration of the photocurrent that is generated upon exposure. Over the top surface of 603, opaque dividers 602 are located between the pixel locations. Connection layer 605 and stacked OLED 607 (shown as a single layer) are then applied over the top surface of PD layer 703 as well as the opaque dividers 702. The height and shape of the opaque dividers 602 above the top surface of the PD layer 603 is selected so that the connector 605 and stacked OLED 607 can form continuous layers over the opaque dividers and the top surface of the PD layer 603 between the opaque dividers 602. This will reduce cross-talk by reducing the vertical diversity of the photocurrent produced by the individual pixels of PD layer 603 and confining the light subsequently emitted by 607 within that same PD pixel location. This embodiment is advantaged for manufacture because 605 and 607 are both continuous over the surface of the PD/substrate and do not require any patterning of these layers. Moreover, although the layers of 605 and 607 are all continuous in this embodiment, cross-talk caused by lateral carrier migration within the layers is also reduced because the pathlength between different pixel areas is increased. Not shown in FIG. 6 are the top layer and/or encapsulation which also would be continuous across the top surface of the upconverter 600.

In some embodiments, the opaque dividers can absorb or reflect the light to which the PD is sensitive. For example, the opaque divider may absorb IR light if the PD layer 603 is sensitive to IR light. Alternatively, or in addition, the opaque divider may be black so that absorbs visible light. The opaque divider can be composed of organic dielectric materials such as a photoresist and generated by a photolithography process. The opaque dividers or materials may also be inorganic dielectric material deposited via vacuum deposition using masks. Alternatively, the opaque divider may be made of reflective metal if separated from overlying or underlying electrodes by electrically insulating layers.

The shape of the light absorbing structure 602 can be a column, a square, triangle, etc. It is contemplated for the shape to be a trapezoid which may have rounded edges. For instance, the light absorbing structure 702 can have a wide base (at or near the optical pixel rear face) leading to a narrower top (at or near the optical pixel front face). Such a structural shape enables electrical continuity of the electrode layers. The trapezoid can have a pitch between them of 5-10 μm. With an array of optical pixels in a display, the opaque dividers can resemble a waffle pattern.

One well-known method of increasing the luminance and color purity of OLED emission is by taking advantage of the optical microcavity effect. An optical microcavity (optical resonance cavity) is a structure formed by a reflecting surface on one side of the microcavity and a semitransparent surface on the opposite side. Multiple reflections between the two surfaces create standing waves, depending on optical distance between the two surfaces, which will intensify some wavelengths of light and decrease others because of constructive and destructive interference effects that will occur depending on whether the emissions are generated at the antinodes or nodes, respectively, of the standing waves. The antinodes occur at different locations depending on the total space between the reflectors, and on the wavelength being optimized. Optical models based on mathematical calculations can be useful in determining the ideal emitter positions for a given structure. In general, modelling of an OLED microcavity suggests that the maximum emission efficiency will be found if the light is generated at an antinode that is some odd multiple of a quarter wavelength between the reflective and semi-transparent surfaces of the microcavity, when adjusted for any phase shifts at the two reflectors. The antinodes for different “colors” will be at different locations within the microcavity since the wavelengths are different. In this case, quarter-wavelength refers to the wavelength within the device medium, not vacuum. In other words, theory predicts that emitting layers according to the emission wavelength should be located at specific distances (i.e., at the antinodes) between the defining surfaces of the microcavity in order to maximize the microcavity effect that increases efficiency.

To generate a microcavity effect in the stacked OLED of upconverters such as 200 or 300 for the optical pixel, the top electrode must be semi-transparent and the bottom electrode reflective. The vertical distance between the bottom electrode and the top electrode and the relative positioning of the light-emitting layer between them may then be selected based on the emission wavelength in order to provide a microcavity effect. The optical pixel can also include a reflector structure when the bottom electrode is transparent. The reflector can be a material configured to reflect light emitted (the second frequency) by the stacked OLED. The reflector can be adjacent the bottom electrode; ideally on the side closest to the substrate. The reflector can be formed by doping, deposition, etc. on the substrate. In embodiments where the PD is located between the electrodes of the stacked OLED, the reflector will preferentially be transparent to light in the first frequency band.

In principle, it is also possible to stack multiple upconverter devices, each with its own PD, on top of each other, thus avoiding the need to pixelate. One upconverter emits light in a first frequency band and the other upconverter emits light in a second frequency band which is different from the first. In the arrangement where two optical upconverters are vertically stacked together, the first upconverter must be substantially transparent to light in a third frequency band (to which the PD of the second (upper) upconverter is sensitive, and the second upconverter must be substantially transparent to light in the second frequency band. Both the laterally patterned display and the vertically stacked upconverter display device can be used to form a multicolor visible image where the color was indicative of the relative intensities of the incident light in the first and third frequency bands.

In particular, the display using the upconverter can be comprised of two optical upconverters arranged together in either a laterally patterned arrangement or in a vertically stacked orientation. The first upconverter can be responsive to light in a first frequency band and emit light in a second frequency band, and the second upconverter can be responsive to light in a third frequency band (i.e., a different first frequency band) and emit light in a fourth frequency band (i.e., a different second frequency band). The first and third frequency bands include different parts of the range from 300 GHz to 400 THz, for example. The second and fourth frequency bands include different parts in the range from 400 THz to 790 THz, for example. This general concept can be extended to arrangements of more than two upconverters.

For example, two upconverter devices can be vertically stacked. Between the first (bottom) and second (top) upconverter devices would be a transparent conductive electrode that forms both the top common (for all areas/pixels) electrode for the first device and the bottom common electrode for the second device. In the bottom upconverter device, the PD could be sensitive to (i.e., absorb) IR light in one IR band (e.g., 700-900 nm) and to green light (generated by its associated OLED). However, in the top upconverter device, the PD could be sensitive to (i.e., absorb) IR light in a different band (e.g., 1000-1500 nm) and to red light (generated by its associated OLED). The top electrode in the second device would partially reflect some of both the R and G light. The user would see a false color image according to the incoming IR light spectral distribution.

In an arrangement where two upconverters are laterally patterned together, the PD layers for the two upconverters can be deposited to occupy alternating adjacent pixels in an array (e.g., stripes or checkerboard), and the light-emitting units of the stacked OLED must be similarly patterned. Such methods for forming such small pixels are known (for example, US20160308132A1).

EXAMPLES

Figure 7:
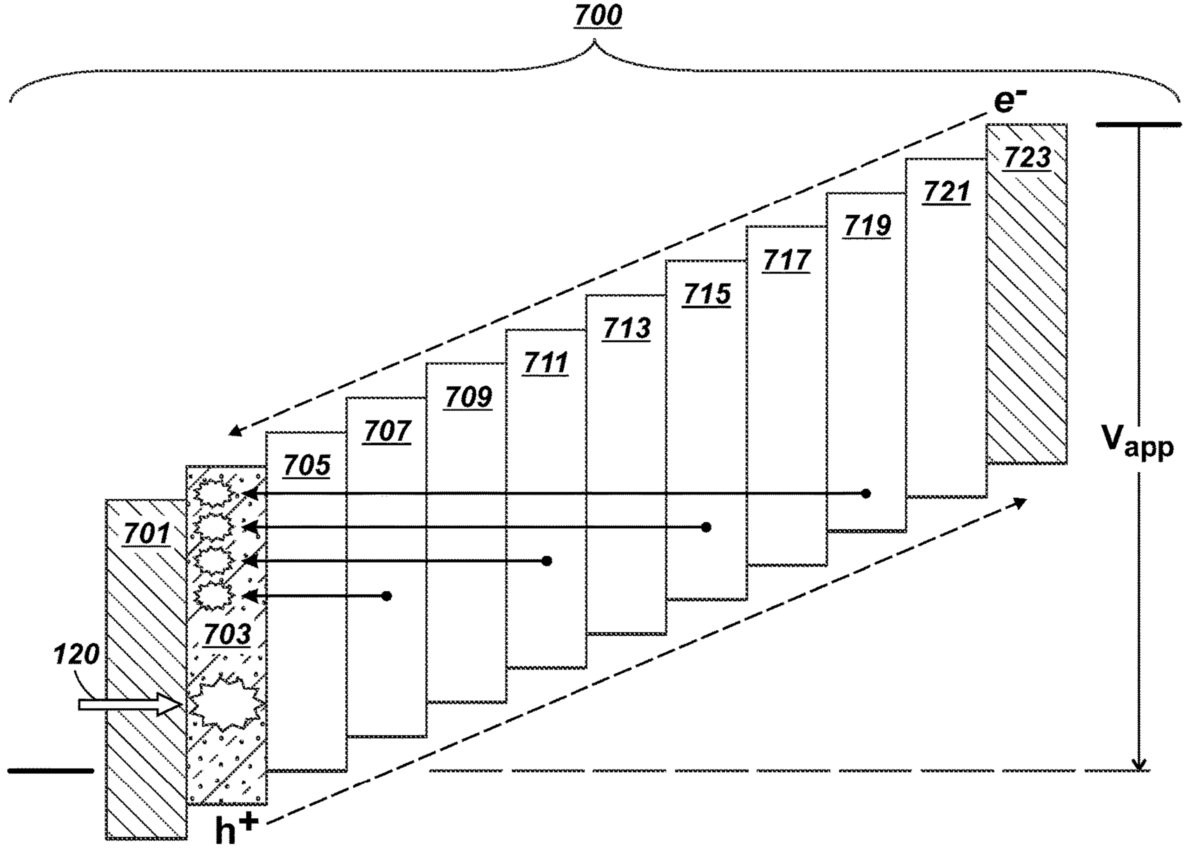
FIG. 7 illustrates the photon-assisted avalanche gain in an OLED 700 that occurs when light is emitted from the OLED, re-absorbed and converted to photocurrent by the PD with greater than 100% quantum efficiency, leading to more current in the OLED and so forth in a positive feedback loop (avalanche mode).

FIG. 7 is a schematic illustration of the energy band diagram for the photon-assisted avalanche gain in an upconverter 700. There are 4 OLED units (707, 711, 715, 719) which are separated by three non-emitting CGLs (709, 713, 717) between two electrodes 701 and 723 which are biased by an applied voltage (Vapp). A photodiode (PD) layer 703 is located between a non-light emitting layer 705 and the electrode 701. Also present is a non-light emitting layer 721 between the OLED unit 719 and the electrode 723.

In operation, input light 120 passes through transparent electrode 701 to PD layer 703, where the input light is absorbed resulting in the creation of a hole-electron pair (illustrated by a star). Because of the electric field generated by the applied voltage, the generated electrons move toward one electrode (in this case, 701) while the holes migrate towards the other electrode (in this case, 723). This photocurrent causes the OLED units 707, 711, 715, 719 to emit light, some of which is absorbed by the PD 703 (as shown by the arrows) which creates additional electron-hole pairs. This leads to more photocurrent in the stacked OLED and so forth in a feedback loop. In the absence of illumination, the PD is reverse biased through electrodes 701 and 723, preventing current flow through the stacked OLED. The photocurrent also causes the CGLs 709, 713, 717 between the OLED units to create additional electron-hole pairs and thus further amplifying the effect and assists the upconverter to operate in an avalanche mode. In this example, four OLED stacks provide a sufficient amount of light to the PD, so that even if a fraction of the emitted OLED light is re-absorbed by the PD layer, enough additional photocurrent still will be generated that leads to yet more OLED emission and so forth in a self-amplifying feedback loop. In other examples, the fraction of absorbed light is such that two OLED units may provide a sufficient amount of light to cause the upconverter to operate in the desired avalanche mode.

This photon-assisted avalanche process is easily understood by considering the photocurrent density, $J/q=S_{IR}\eta_{PD,IR}+S_{LED}\eta_{PD,LED}$, that results from absorption of incident IR and visible OLED light (with photon densities $S_{IR}$ and $S_{LED}$, and corresponding photocurrent quantum efficiencies $\eta_{PD,IR}$, and $\eta_{PD,LED}$, respectively), where q is the electronic charge. Since the generated OLED photon flux is set by the same current density together with the emission quantum efficiency of each of the M tandem subunits according to $S_{LED}=(J/q)M\eta_{LED}$, the photon-to-photon up-conversion efficiency is $S_{LED}/S_{IR}=[M\eta_{PD,IR}\eta_{LED}/(1-f)]$, where $f=M\eta_{PD,LED}\eta_{LED}$ is the feedback factor from the OLED to the PD. In prior art OLED upconverters, where M=1, the denominator in the expression for $S_{LED}/S_{IR}$ is always finite because the quantum efficiency product $\eta_{PV,LED}\eta_{LED}$ is always less than unity. However, when M>1, the denominator can approach zero and the up-conversion efficiency diverges. Based on $\eta_{LED}\approx1$ for state-of-the-art phosphorescent green OLEDs and $\eta_{PD,LED}\sim0.5$ estimated for converting a fraction of the OLED light back to photocurrent, a 4- to 6-stack OLED should be sufficient to achieve avalanche gain in a high-resolution imaging system with realistic optical losses as discussed below.

Figure 8:
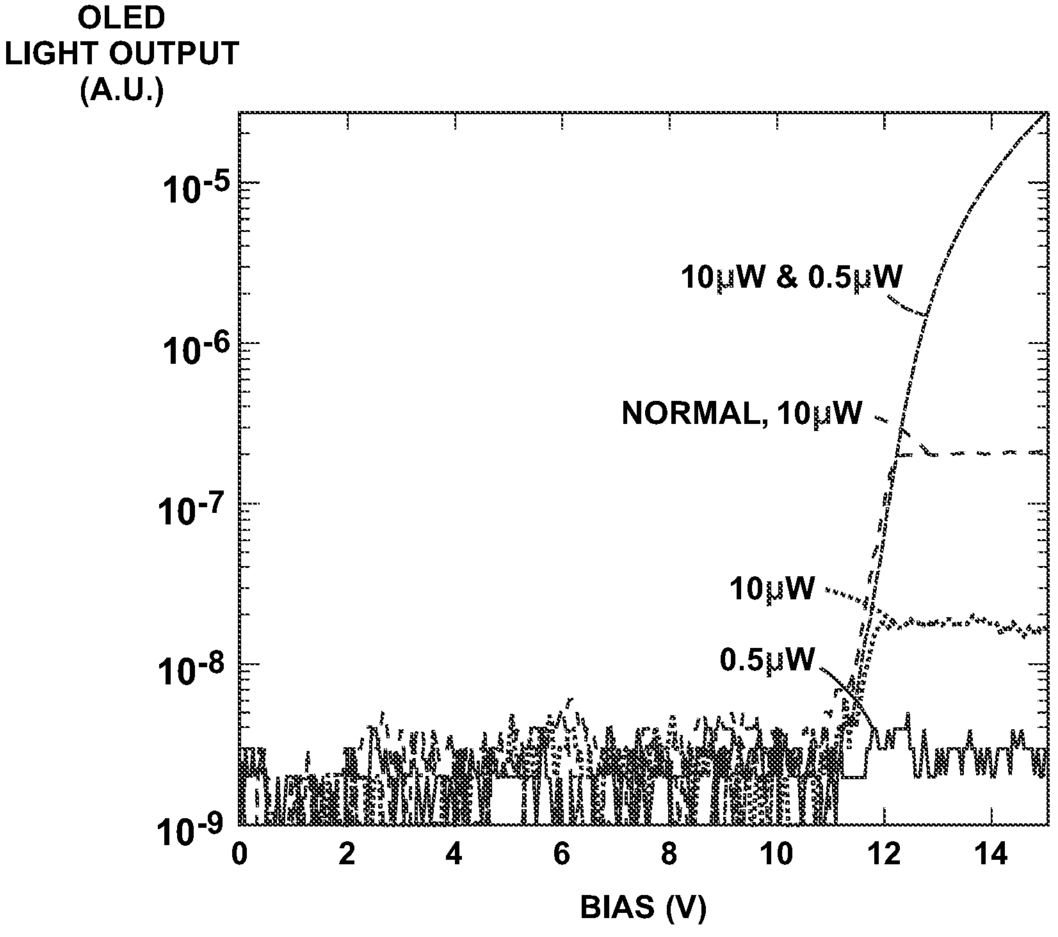
FIG. 8 shows OLED light emission intensity for an embodiment of the upconverter system with different degrees of self-coupling and input illumination levels.

FIG. 8 shows OLED light emission intensity for an embodiment of the upconverter made with discrete OLED and Si PD devices connected in series (PD is reverse biased) with a power supply. In this experiment, the OLED and PD were overlapped resulting in different degrees of self-coupling and subjected to different input illumination levels. Using a 6-stack red OLED device (peak EQE (external quantum efficiency)~160% into air), the OLED face-to-face is mated with a standard Si photodiode (PD). On the PD side of the OLED, external illumination was added using a 785 nm laser. When the OLED and PD were optically separated ("decoupled"), the current is limited to the PD "dark photocurrent" of about $10^{-8}$ to $10^{-9}$ A for all bias voltages and laser powers (e.g., decoupled, 10 μW). Partially coupling (via amount of overlap) the two devices with index-matching fluid such that the feedback factor f~0.9 yields a finite gain of $(1-f)^{-1}$~10 in both the current and light output from the OLED (half-coupled, 10 μW). The feedback factor (f) is the product of the OLED IQE (internal quantum efficiency, $M\eta_{LED}$) times the self-coupling efficiency of the PD (i.e. $\eta_{PD,LED}$ is the probability that a photon emitted by the LED is absorbed by the photodiode and converted to photocurrent). When the devices are fully coupled (i.e., aligned with full overlap between the PD and OLED), f>1 and the device operates in avalanche mode, where even a minute input of optical stimulus causes the current and light output to increase to the limit set by the OLED I-V characteristic (full-coupled 10 and 0.5 μW). In this example, an input of 0.5 μW yields no detectable light emission from the OLED in decoupled mode at 15 V, whereas fully-coupled avalanche mode yields the full OLED output which is a gain of more than $10^4$.

Figure 9:
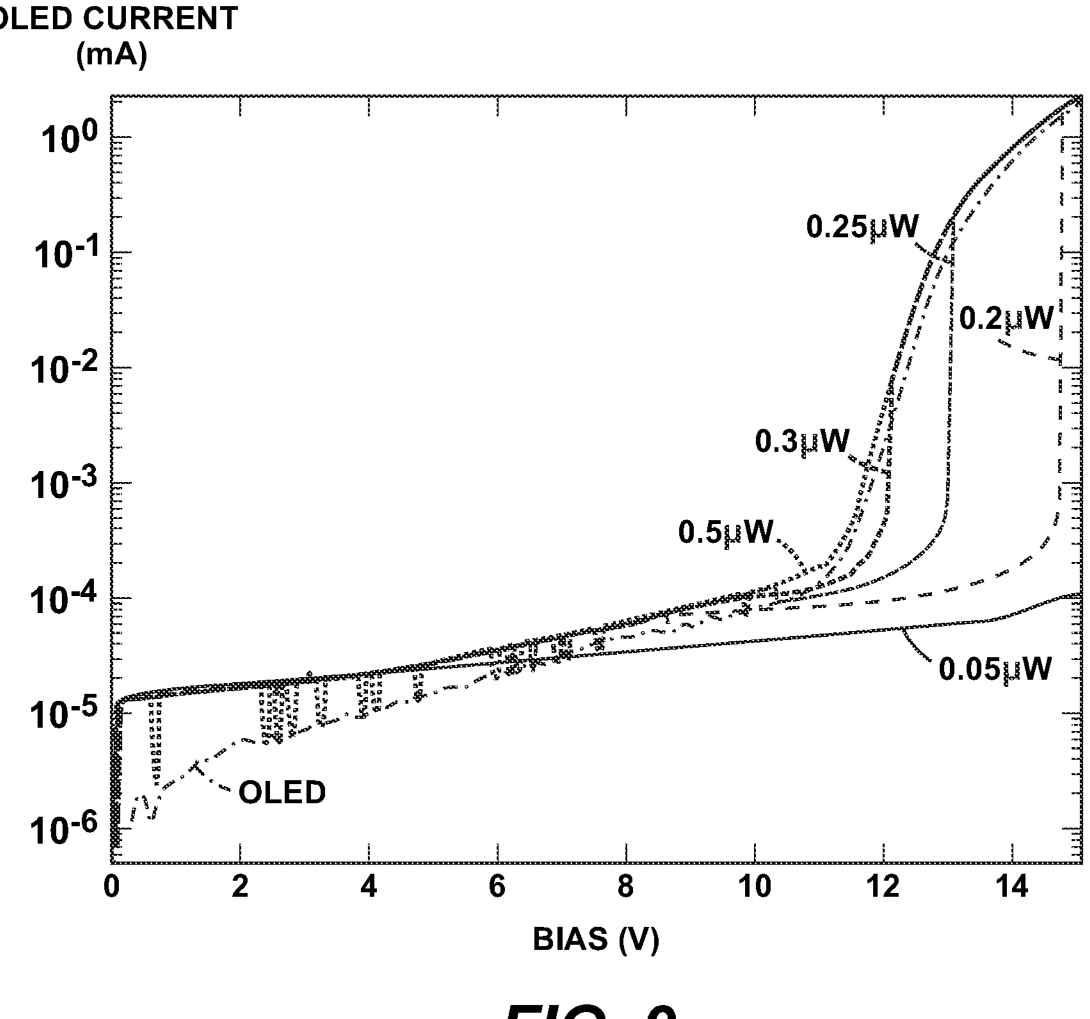
FIG. 9 shows experimentally-measured current resulting from different input laser powers.
Figure 10:
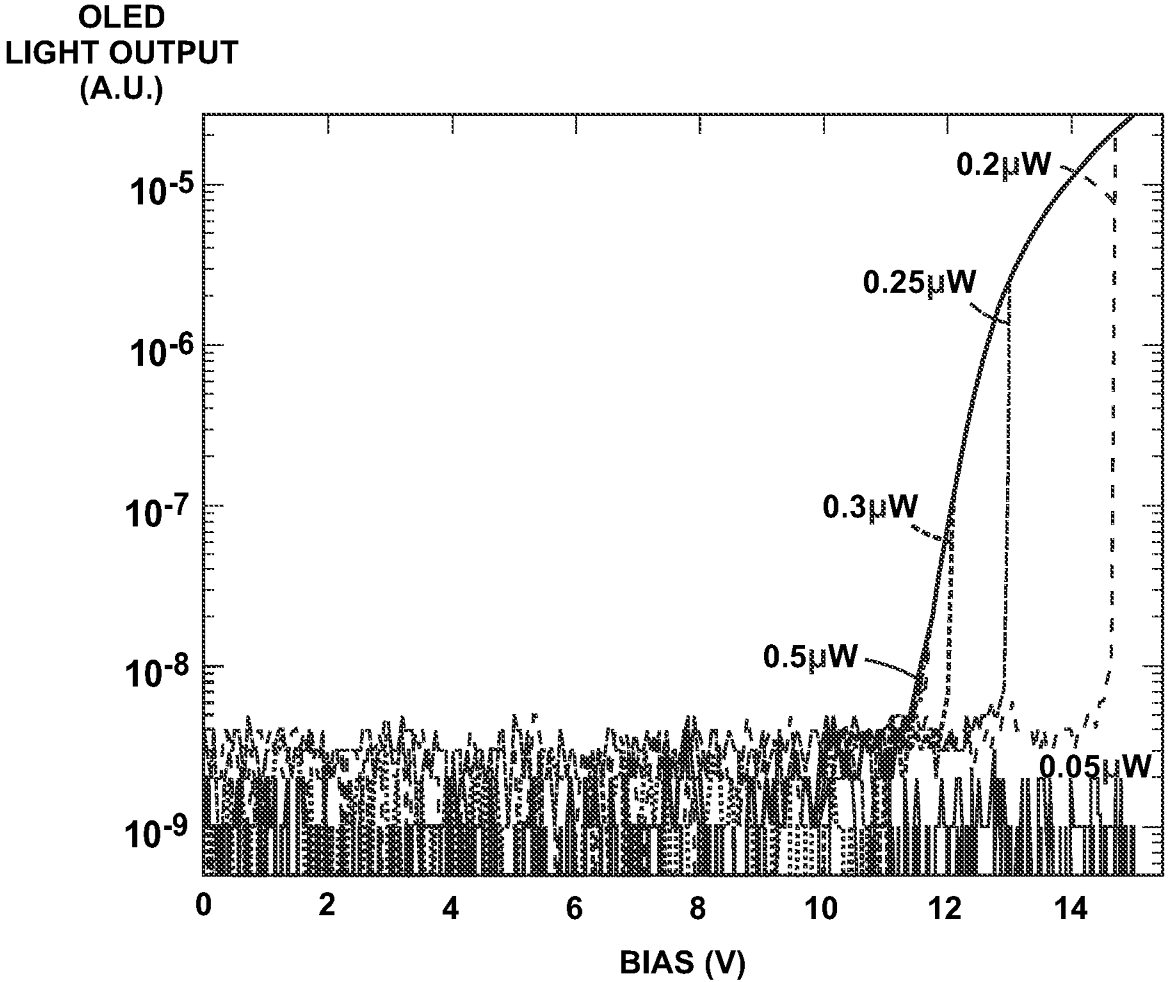
FIG. 10 shows experimentally-measured OLED light output resulting from different input laser powers.
Figure 11:
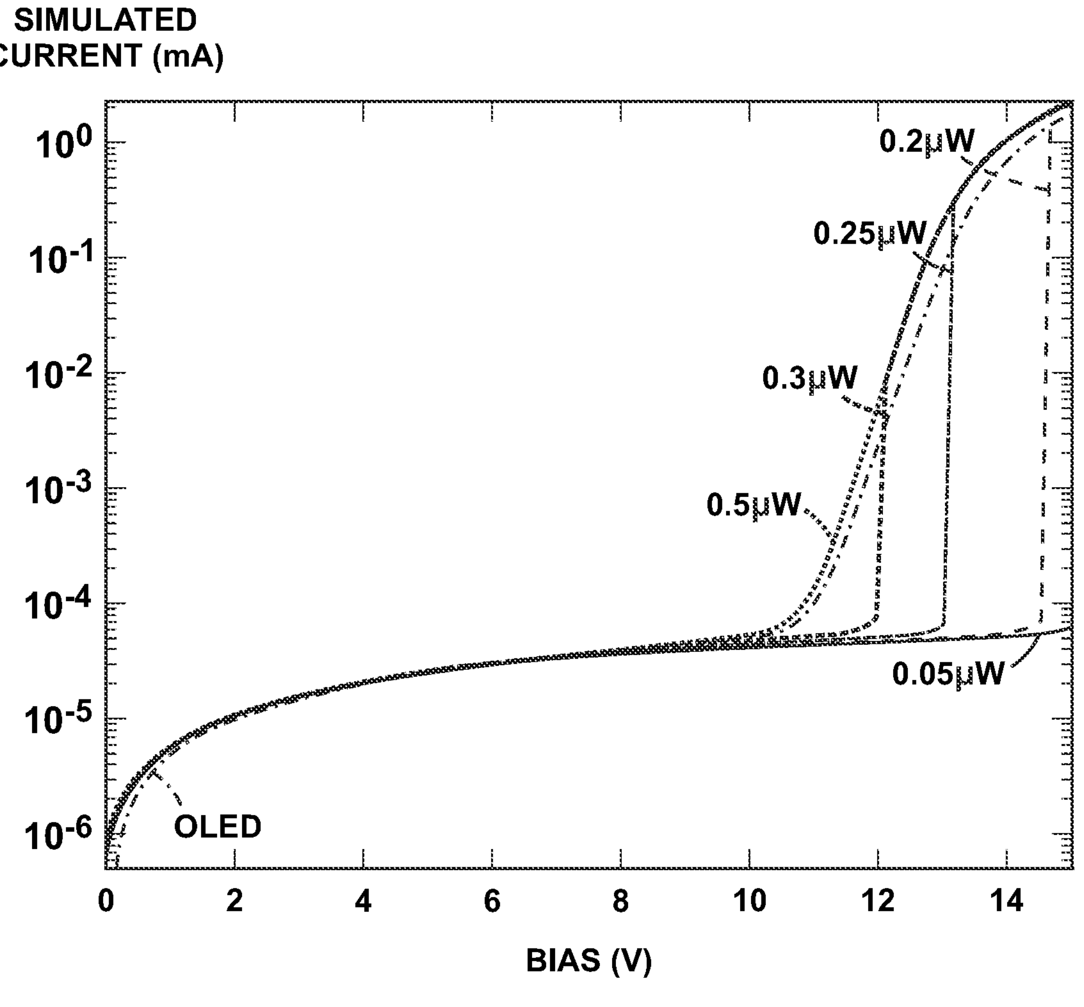
FIG. 11 shows simulated current-voltage characteristics illustrating avalanche behavior.
Figure 12:
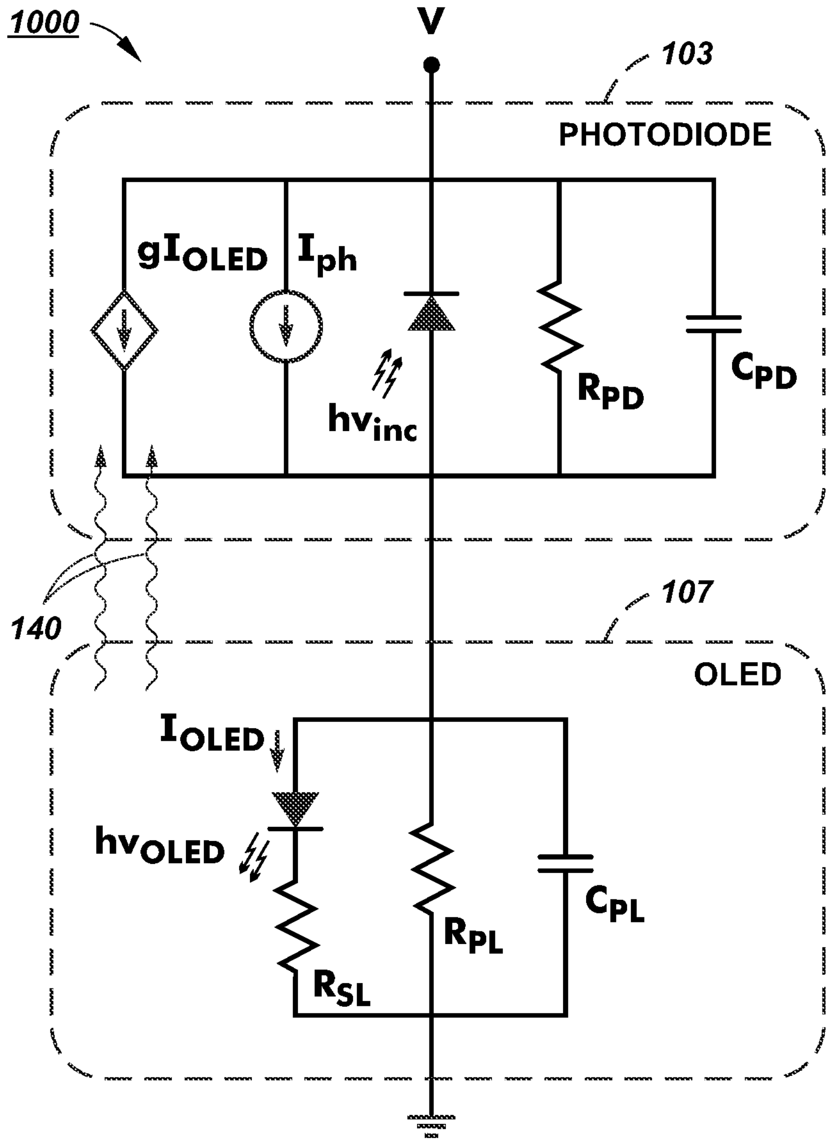
FIG. 12 shows an equivalent circuit 1000 of an embodiment of the upconverter system.
Figure 13:
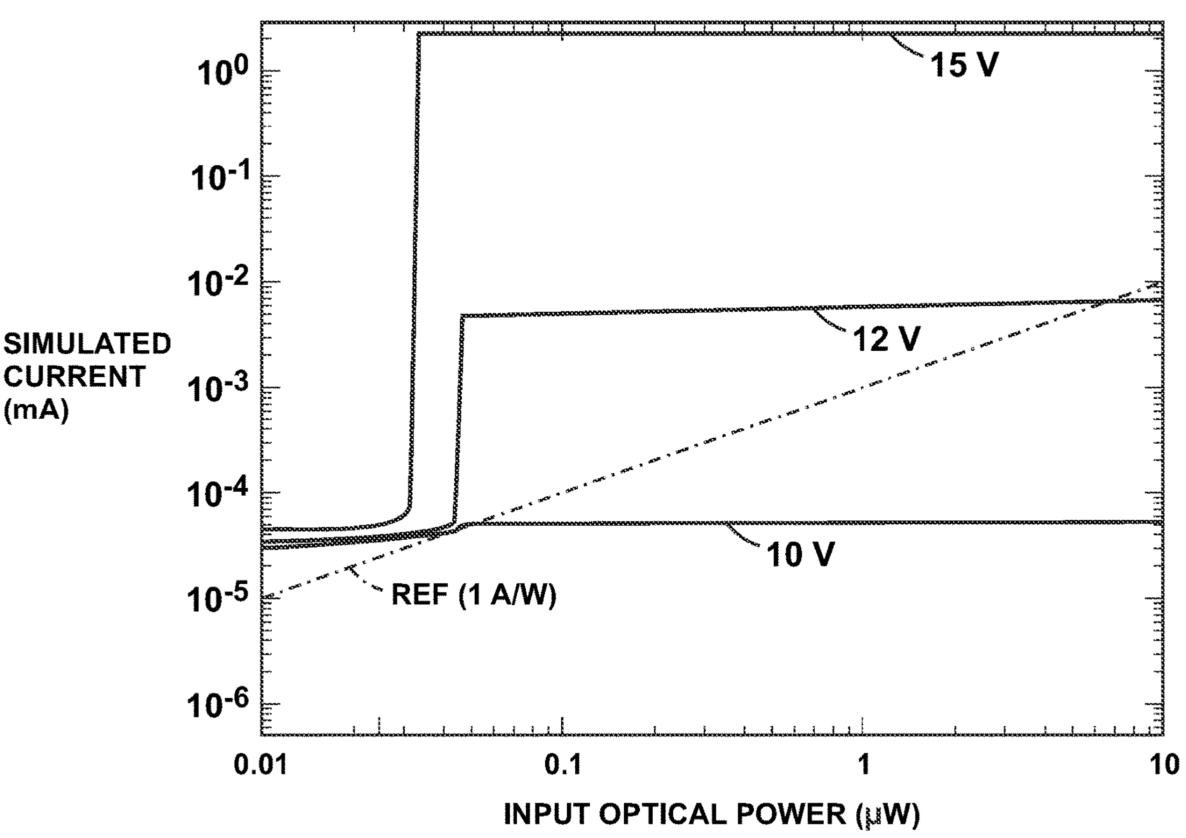
FIG. 13 shows a simulation computing the input optical power-to-output OLED current responsivity for three different bias voltages; the dashed black line shows a 1 A/W responsivity for reference.

FIGS. 9-10 demonstrate the increase in avalanche threshold voltage with decreasing input illumination for the same 6-stack OLED used in FIG. 8. FIG. 9 shows experimentally-measured current resulting from different input laser powers and FIG. 10 shows experimentally-measured OLED light output resulting from different input laser powers. FIG. 11 shows simulated current-voltage characteristics reproducing the avalanche behavior in FIG. 9 based on the equivalent circuit model 1000 shown in FIG. 12. FIG. 13 shows a simulation computing the input optical power-to-output OLED current responsivity for three different bias voltages; the dashed line shows a 1 A/W responsivity for reference. As can be appreciated from FIG. 9, the threshold voltage for avalanche decreases for increasing external illumination power; for a bias of 15 V or less, a 50 nW input falls below the detection limit and produces no measurable OLED response (FIG. 10). The detection limit is set by the dark current density of the PD, which in this case is ~50 nA. Using the equivalent circuit model shown in FIG. 12, the avalanche behavior of the system as shown in FIG. 11 can be accurately reproduced. Based on this model, FIG. 13 shows the system responsivity as a function of input light intensity, highlighting the giant gain relative to a linearly responding device with constant responsivity (dashed line).

The behavior of the photon-assisted avalanche process is similar in many respects to that of a standard avalanche photodiode operated in Geiger mode (e.g., a silicon photomultiplier). As such, it is a bistable device that, once triggered, remains at full output even after the input light intensity decreases to zero (i.e., will not turn off when external light turns off). Optical bistable devices have a wide range of applications in optical signal processing, optical logic, image-retaining displays, and so forth. To make this device useful for imaging with an output intensity that is proportional to the input, it can be driven with a high duty cycle pulse train, where the intervals between the pulses serve to reset each pixel region to sense during the next cycle. Because the avalanche takes longer to build up as the input intensity decreases (a fundamental trait of any avalanche process), the time average OLED emission resulting from the pulse train scales with the input light intensity.

Figure 14:
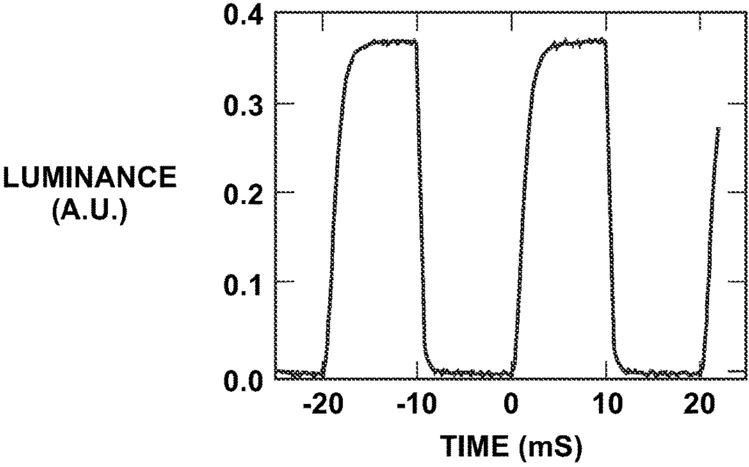
FIG. 14 shows transient electroluminescence response of a 5-stack OLED upconverter driven by 15 V pulses.
Figure 15:
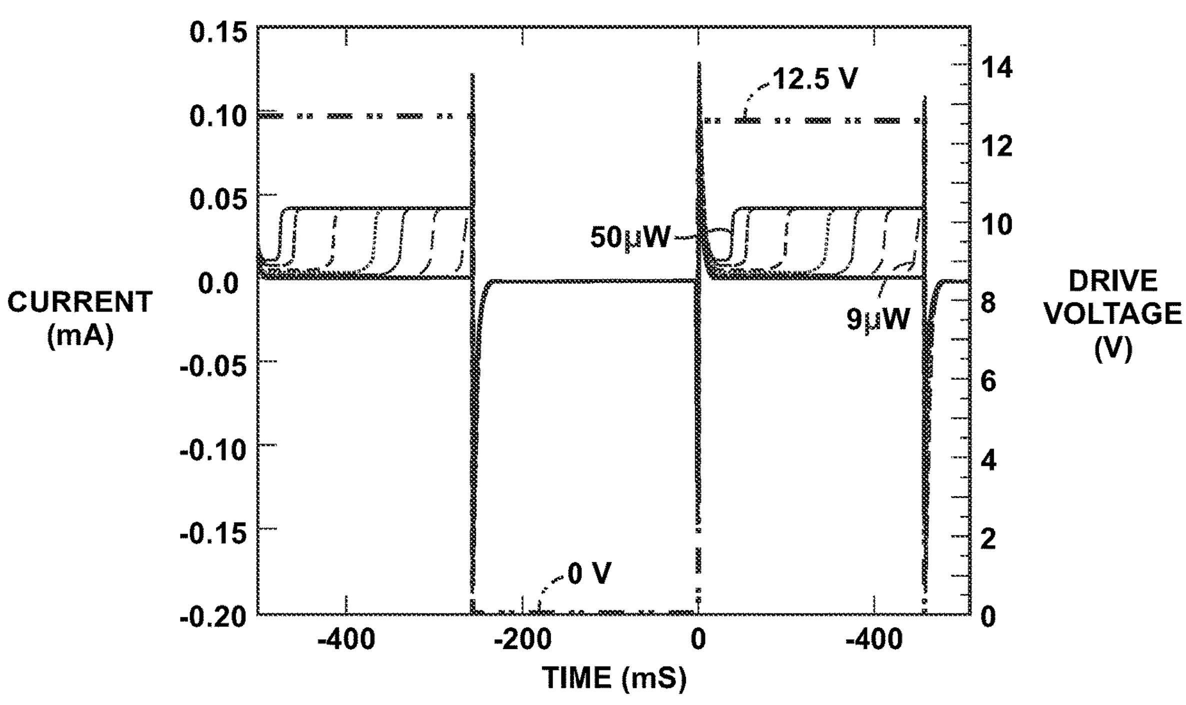
FIG. 15 shows the transient current response in decoupled and fully-coupled mode driven by a 2 Hz, 12.5 V pulse for varying input power levels.

FIG. 14 shows transient electroluminescence response of the above 6-stack device driven by 15 V pulses. FIG. 15 shows transient current response measured for the decoupled and fully-coupled upconverter system driven by a 2 Hz, 12.5 V pulse train for varying CW (continuous wave) input power levels. The avalanche current builds up to its maximum (established by the DC operating point in FIG. 13) faster with increasing input power; the current in the decoupled case is too small to be seen on this scale. It subsequently shows that, when the OLED-PD system is driven by a 2 Hz, 12.5 V square wave, the current reaches its avalanche saturation value faster for increasing (CW) optical input power levels as expected. This contrasts with the optically-decoupled case, where the current is roughly 100× smaller and essentially follows the dark charge/discharge waveform. The time average current determined from integrating these transients is shown in FIG. 15. The coupled system exhibits a nearly-ideal logarithmic response to the input power and has a ~100× gain in output OLED luminance relative to the standard decoupled mode of operation. Increasing the drive voltage of the pulse train can further increase the gain (>1000 at 15 V) and reduce the detection limit of the system (to <50 nW/cm2). The slow response in FIG. 15 is due to the capacitance of the relatively large area (2.5×2.5 $cm^2$) OLED and PD employed for the experiment. The dramatic reduction in capacitance that occurs for the ~5×5 $\mu m^2$ pixel regions of the upconverter system can significantly speed up the avalanche dynamics and should readily facilitate the use of video rate (>60 Hz) pulse trains with dynamics similar to commercial OLED displays.

It is emphasized that this avalanche process is immune to burnout under high flux illumination—either inadvertent or intentional targeting—since the OLED always series-limits the total current flow. One of the valuable aspects of the avalanche process is its ability to deliver high IR-to-VIS optical gain; however, if unexpected problems arise with this mode of operation or if certain situations demand a strictly linear input-output response, the PD/stacked OLED based upconverter can be designed to achieve sub-unity feedback factor (f~0.9). The gain in this case will be more modest (~10× as in the partially-coupled case), but the device operation in this stable feedback mode will remain fully linear and can be driven with a simple constant DC bias.

Figure 16:
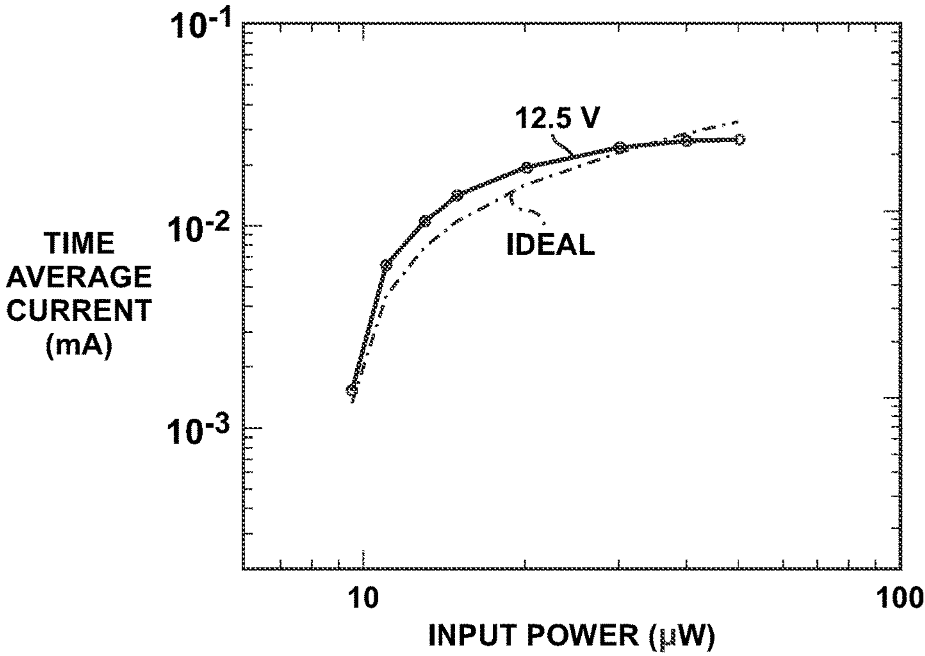
FIG. 16 shows time-average of the OLED current for a 5-stack microcavity OLED upconverter 900 compared to the optically-decoupled control case.
Figure 17:
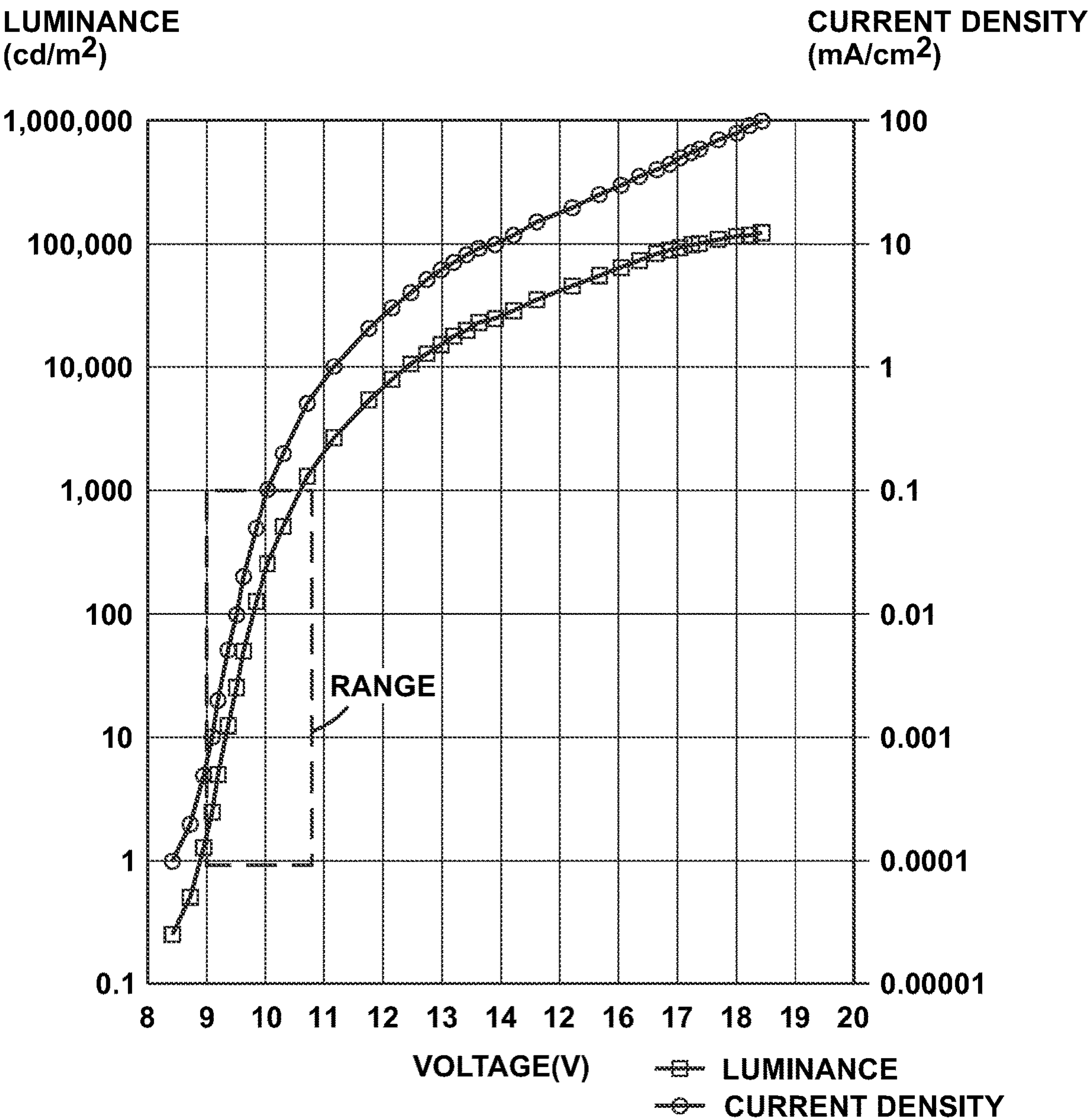
FIG. 17 shows current density and luminance as a function of operating voltage.

FIGS. 16-17 show the performance for an upconverter 900 with a 5-stack green OLED arrangement that utilizes a microcavity effect with the composition shown in Tables 1 and 2.

TABLE 1

Composition of 5-Stack Green OLED 900

| Layer # | Type | Thickness (Å) | Composition |
|---|---|---|---|
| 1 | Anode | 90 | ITO on Glass |
| 2 | HIL | 40 | HIL-1 |
| 3 | HTL1 | 360 | HTM-A |
| 4 | HTL2 | 50 | HTM-B |
| 5 | Green LEL #1 | 200 | GHP + 10% GD |
| 6 | CGL #1 | 470 | |
| 7 | HTL3 | 810 | HTM-A |
| 8 | HTL4 | 50 | HTM-B |

TABLE 1-continued

Composition of 5-Stack Green OLED 900

| Layer # | Type | Thickness (Å) | Composition |
|---|---|---|---|
| 9 | Green LEL #2 | 200 | GHP + 10% GD |
| 10 | CGL #2 | 470 | |
| 11 | HTL5 | 810 | HTM-A |
| 12 | HTL6 | 50 | HTM-B |
| 13 | Green LEL #3 | 200 | GHP + 10% GD |
| 14 | CGL #3 | 470 | |
| 15 | HTL7 | 750 | HTM-A |
| 16 | HTL8 | 100 | HTM-B |
| 17 | Green LEL #4 | 200 | GHP + 10% GD |
| 18 | CGL #4 | 470 | |
| 19 | HTL9 | 760 | HTM-A |
| 20 | HTL10 | 100 | HTM-B |
| 21 | Green LEL #5 | 200 | GHP + 10% GD |
| 22 | ETL | 250 | ETM-A |
| 23 | EIL | 100 | ETM-B + 3% Li |
| 24 | Cathode | 105 | Ag |

TABLE 2

Composition of CGL #1-#4 in 900

| Layer # | Type | Thickness (Å) | Composition |
|---|---|---|---|
| $1^{st}$ Layer | ETL | 200 | ETM-A |
| $2^{nd}$ Layer | Doped ETL | 100 | ETM-B + 3% N-Dopant (Li) |
| $3^{rd}$ Layer | ETL | 20 | ETM-B |
| $4^{th}$ Layer | Doped HTM | 150 | HTM-A + 8% P-Dopant |

In Tables 1 and 2, HIL-1 is a commercially available hole injection material. HTM-A and HTM-B are commercially available hole transport materials. P-Dopant is a commercially available organic dopant. ETM-A and ETM-B are commercially available electron transport materials. GHP is a commercially available green host material and GD is a commercially available green phosphorescent emitter. This stacked OLED has 5 green light-emitting stacks, separated by 4 CGLs.

FIG. 16 shows current density as a function of input light (as μW applied to the laser) for 900. FIG. 17 shows a plot of current density and luminance vs applied voltage for 900. A dynamic range covering 5 orders of magnitude with a peak luminance of 100,000 cd/m$^2$ is possible with this device. The OLED luminance is anticipated to be in a range between 0.01-1000 cd/m$^2$ (as indicated in FIG. 17) to allow margin for potential losses through projection optics and absorption by additional optical crosstalk control structures. The formulation based on phosphorescent dopants and electron/hole blocking layers provides a high performing microcavity OLED stack with luminance efficiency of 250 cd/A in the operating range of night vision displays and a long lifetime exceeding 30,000 hours.

The power requirement of the integrated PD+OLED upconverter image intensification device is predicted to be low. The maximum bias voltage of 16.5 V ($V_{PD}$=4V and $V_{OLED}$=12.5V) and maximum current density of 0.4 mA/cm$^2$ leading to a maximum power of 6.6 mW/cm$^2$, which translates to a maximum total power of 26.4 mW for a 4 cm$^2$ (2 cm×2 cm) PD+stacked OLED device. With an average display brightness of 30% of peak, the average power for 2 devices equals 15.8 mW and translates into 475 mWh for 24 hr energy consumption assuming 80% efficiency for the power electronics. An SR44 battery (11.6 mm diameter, 5.4 mm height) can power the night vision system for 15 hours. This level of low energy consumption also makes it possible to run this system on self-charging power cells.

The following upconverters A-D were prepared over a glass substrate according to Table 3:

TABLE 3

Composition of Upconverters A, B, C and D

| Layer | Type | Composition | A | B | C | D |
|---|---|---|---|---|---|---|
| | | | Thickness (Å) | | | |
| 1 | Electrode | ITO | 1400 | 1400 | 1400 | 1400 |
| 2 | HIL | C70 | 500 | 500 | | |
| 3 | HIL | HTM-A + 6% P-Dopant | | | 100 | 100 |
| 4 | HIL | HTM-B | | | 100 | 100 |
| 5 | PD | ClAlPc + 75% C70 | 500 | 500 | | |
| 6 | EBL | HTM-B | 500 | 500 | 500 | 500 |
| 7 | G LEL#1 | GHP + 10% GD | 300 | 300 | 300 | 300 |
| 8 | HBL | ETM-A | 100 | 100 | 100 | 100 |
| 9 | ETL | ETM-B | 25 | 100 | 25 | 100 |
| 10 | CGL #1 | See Table 4 | | 450 | | 450 |
| 11 | EBL | HTM-B | | 70 | | 70 |
| 12 | G LEL #2 | GHP + 10% GD | | 300 | | 300 |
| 13 | HBL | ETM-A | | 100 | | 100 |
| 14 | ETL | ETM-B | 25 | 100 | 25 | 100 |
| 15 | CGL#2 | See Table 4 | | 370 | | 370 |
| 16 | EBL | ETM-B | | 70 | | 70 |
| 17 | G LEL#3 | GHP + 10% GD | | 300 | | 300 |
| 18 | HBL | ETM-A | | 100 | | 100 |
| 19 | ETL | ETM-B | 25 | 50 | 25 | 50 |
| 20 | EIL-1 | ETM-B + 0.005% Li | 500 | 500 | 500 | 500 |
| 21 | EIL-2 | ETM-B + 2% Li | 100 | 100 | 100 | 100 |
| 22 | Electrode | Ag | 400 | 400 | 400 | 400 |

TABLE 4

Composition of CGL #1 and #2 in Table 3

| Layer | Composition | CGL #1 | CGL #2 |
|---|---|---|---|
| | | Thickness (Å) | |
| 1 | ETM-B + 2% Li | 100 | 100 |
| 2 | ETM-B | 100 | 70 |
| 3 | HTM-A + 6% P-Dopant | 150 | 150 |
| 4 | HTM-A | 100 | 100 |

Upconverter A is a prior art device with a PD with a single OLED stack where C is the same with a non-sensitive HIL/HTL replacing the PD layer. Upconverters B is an inventive stacked OLED with 3 OLED stacks (units) separated by two CGLs where D is the same with a non-sensitive HIL/HTL replacing the PD layer. The PD in upconverters A and B is sensitive to both red light as well as green light.

Figure 18:
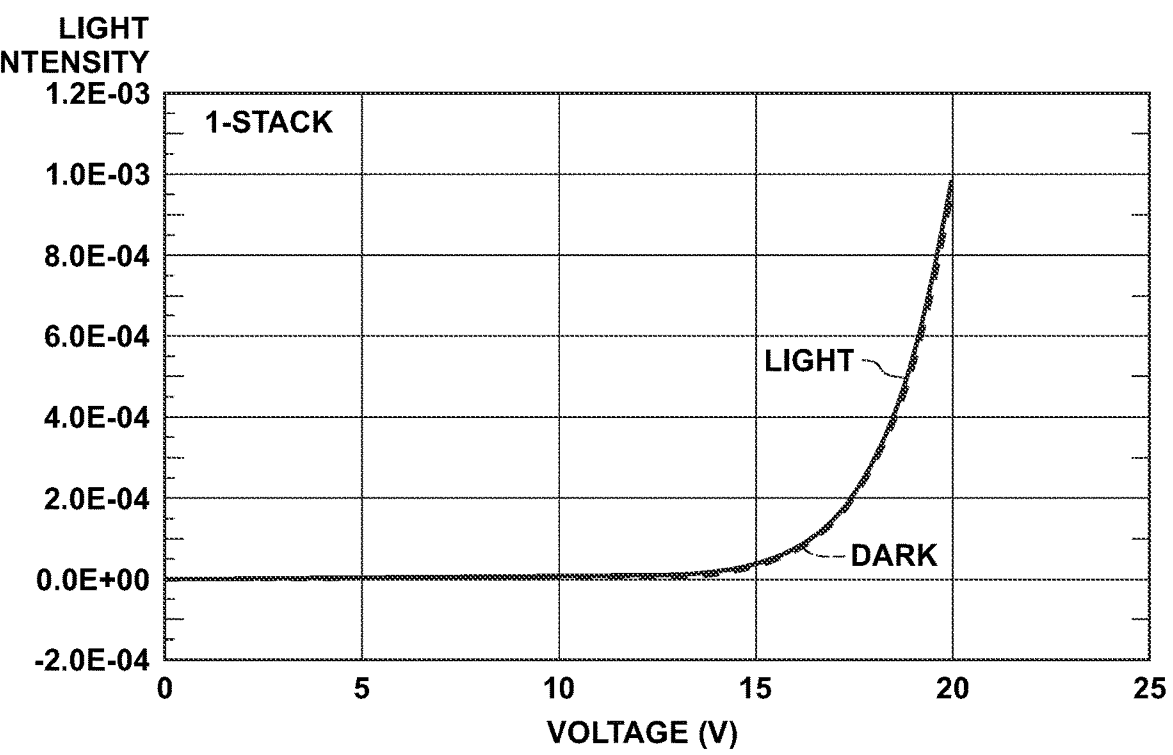
FIG. 18 shows the Light Intensity vs Voltage for a prior art upconverter A with and without inputted light.

FIG. 18 shows the results for prior art upconverter A where the voltage was varied from 0-20 V while either the upconverter was held in the dark (no activation of the PD) compared to where red light was inputted to the PD through the substrate. There is only a very small amount of increased emission when the PD is exposed compared to no exposure (dark).

Figure 19:
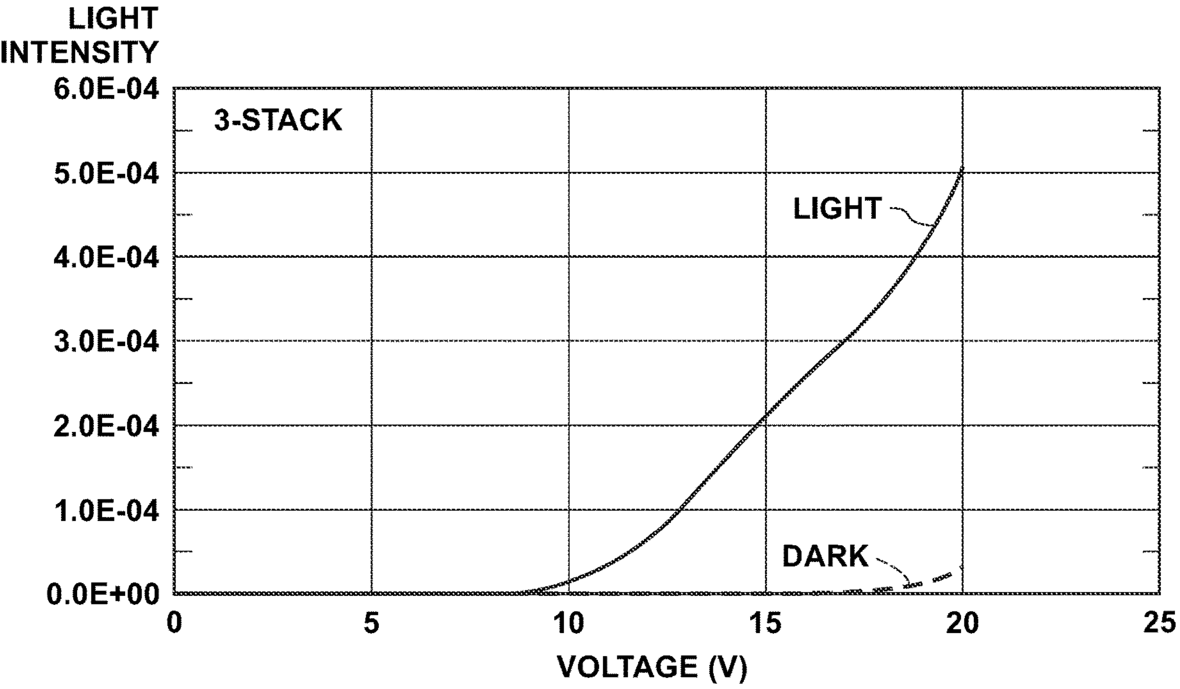
FIG. 19 shows the Light Intensity vs Voltage for an inventive upconverter B with and without inputted light.

FIG. 19 shows the results for inventive upconverter B under the same experimental conditions as in FIG. 18. There is a large increase in light emission when the PD is exposed compared to no exposure (dark). Upconverter B, with an OLED with three G LEL stacks separated by 2 CGLs can cause the device to enter an avalanche mode where the output emission (in this example, green) is greatly amplified when the PD is activated by inputted light (in this case, red).

Upconverters C and D without a PD are insensitive to inputted light. There is no difference in their response to applied voltage as described for upconverters A and B.

Moreover, it has been found experimentally that the "speed of response" of the increase of light (amplification/ avalanche) increases when the voltage across the OLED electrodes is increased from below the Vth of the stacked OLED to above the Vth. In both the linear region (feedback loop less than one, so no avalanche behavior, but still light amplification) and the avalanche region (e.g., loop gain>1) the speed of response is faster with higher device voltage. The speed of response also depends on the amount of incoming light. Overall, a short frame time (i.e., 60 Hz or 16.7 msec) in which avalanche behavior is achieved is desirable. This may require a higher "on voltage" above Vth to the OLED to achieve quickly. At the end of the frame time, the circuit voltage is reduced to below Vth between each frame time in order to reset the amplification/avalanche process.

It should be understood that the disclosure of a range of values is a disclosure of every numerical value within that range, including the end points. It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be apparent to those skilled in the art that numerous modifications and variations of the described examples and embodiments are possible considering the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. It should be understood that modifications to the embodiments disclosed herein can be made to meet a particular set of design criteria. Therefore, while certain exemplary embodiments of the device and methods of using and making the same disclosed herein have been discussed and illustrated, it is to be distinctly understood that the invention is not limited thereto but may be otherwise variously embodied and practiced within the scope of the following claims.

PARTS LIST

100 Upconverter
101 Substrate
103 Photodiode (PD) Layer
105 Connector Layer
107 Stacked OLED Structure without electrodes
109 1$^{st}$ OLED Light-emitting Unit (1$^{st}$ stack)
111 Charge Generation Layer (CGL)
113 2$^{nd}$ OLED Light-emitting Unit (2$^{nd}$ stack)
115 Top Layer
120 Input Light
130 Photocurrent
140 Emission from the OLED Light-Emitting Units
200 Upconverter
117 Bottom Electrode
119 Top Electrode
207 Stacked OLED with Electrodes
121 Electrical connection/Power Source
300 Upconverter
307 Stacked OLED with Electrodes
400 Upconverter
401 Substrate
402 Pixel Definition Layer
405 Connector Layer
412 Transparent Electrode Layer
412B, 412G, 412R Individual Segments of the Transparent Electrode Layer
403 Photodiode Layer segments
410 Non-light Emitting OLED Layer
411 Pixelated Three Stack OLED
413 1$^{st}$ OLED unit (Stack)
415 CGL
417 2$^{nd}$ OLED unit (Stack)
419 CGL
421 3$^{rd}$ OLED unit (Stack)
423 Non-light Emitting OLED Layer
425 Optional top layer
427 Encapsulation layer
418 Top Electrode
430B, 430G, 430B Colored Pixels
500 Upconverter
511 Pixelated Three-stack OLED
501 Substrate
502 Electrically Insulating material (Pixel Definition Layer)
503 Photodiode layer
512 Transparent Electrode Layer
512B, 512G, 512R Individual Segments of the Transparent Electrode Layer
510 Non-Light Emitting OLED layers
513 1$^{st}$ OLED Light-emitting Unit (first stack of three)
515 1$^{st}$ Charge-Generation Layer (CGL)
517 2$^{nd}$ Light-Emitting Unit (second stack of three)
519 2$^{nd}$ Charge-Generation Layer (CGL)
521 3$^{rd}$ Light-Emitting Unit (third stack of three)
523 Non-Light Emitting OLED layers
518 Second Electrode
527 Encapsulation
525 Top Layer
525B, 525G, 525R Color Filters
530B, 530G, 530R Colored Pixels
600 Upconverter
601 Substrate
603 Photodiode Layer
632, 652, 672 Pixel Locations Within the Photodiode Layer
605 Connector Layer
607 Stacked OLED
602 Optical Dividers
700 Upconverter
701 Transparent Electrode
703 Photodiode Layer
705 Non-Emitting Layers
707 1$^{st}$ OLED unit (Stack)
709 CGL
711 2$^{nd}$ OLED unit (Stack)
713 CGL
715 3$^{rd}$ OLED unit (Stack)
717 CGL
719 4$^{th}$ OLED unit (Stack)
721 Non-light Emitting Layer
723 Top Electrode
Vapp Applied Voltage
$e^-$ Electron
$h^+$ Hole
900 5-stack Green OLED upconverter
1000 Equivalent circuit

What is claimed is:

1. An optical upconverter, comprising:

a substrate with a photodiode layer coupled to a stacked organic light emitting diode (OLED), the stacked OLED comprising at least two OLED light-emitting units separated by a charge-generation layer (CGL);

wherein photocurrent generated by the photodiode layer causes light emission from the stacked OLEDs; and the photodiode layer is configured to generate the photocurrent from light that falls within at least a first frequency band;

the stacked OLED is configured to generate light that falls within a second frequency band;

wherein the photodiode layer is configured to receive light of the second frequency band from the stacked OLED and generate additional photocurrent from the second frequency band as well as the first frequency band;

wherein the stacked OLED additionally comprises bottom and top electrodes electrically connected to a power source wherein the top electrode is transparent or semitransparent to the light of the second frequency band, wherein the power source provides a constant voltage bias that is below the voltage threshold (Vth) of the stacked OLED for at least some period of time during operation.

2. The optical upconverter of claim 1, wherein:

the first frequency band includes frequencies within a range from 300 GHz to 400 THz; and the second frequency band includes frequencies within a range from 400 THz to 790 THz.

3. The optical upconverter of claim 1 wherein the substrate blocks or reflects light in the second frequency band.

4. The optical upconverter of claim 1 which additionally comprises:

a substrate that is transparent to light of the first frequency band wherein:

the photodiode is a layer located between the substrate and the bottom electrode of the stacked OLED.

5. The optical upconverter of claim 1 which additionally comprises:

a substrate that is transparent to light of the first frequency band but is not transparent to the second frequency band; and a top layer above the stacked OLED that is transparent to light of the second frequency band but is not transparent to the first frequency band.

6. The optical upconverter of claim 1 wherein:

the photodiode layer comprises an admixture of a material that generates a photocurrent when exposed to a light of the first frequency band and a material which generates a photocurrent when exposed to a light of the second frequency band.

7. The optical upconverter of claim 6 wherein both materials in the admixture are organic.

8. The optical upconverter of claim 1 wherein the stacked OLED is divided into pixel segments in order to form optical pixels that are part of a display.

9. The optical upconverter of claim 8 wherein the photodiode is patterned into segments that are electrically separated.

10. The optical upconverter of claim 8 wherein at least some of the layers of the stacked OLED in the pixel segment are separated from other pixel segments by a pixel definition layer.

11. The optical upconverter of claim 8 wherein at least some of the layers of the stacked OLED are common across all pixel segments where the pixel segments are defined by a color filter array located over the stacked OLED.

12. The optical upconverter of claim 11 which additionally comprises optical dividers that define the pixel segments wherein the optical dividers are located under the common layers of the stacked OLED and above the substrate.

13. The optical upconverter of claim 12 wherein the optical dividers are located under the common layers of the stacked OLED and above the photodiode layer.

14. The optical upconverter of claim 1 wherein the stacked OLED comprises at least three OLED light-emitting units, each separated from the other units by a charge-generation layer (CGL).

15. The optical upconverter of claim 1 wherein in the second frequency band, a red light generated by the stacked OLED is the range of 620-660 nm.

16. The optical upconverter comprising a substrate with a photodiode layer coupled to a stacked organic light emitting diode (OLED), the stacked OLED comprising at least two OLED light-emitting units separated by a charge-generation layer (CGL);

wherein photocurrent generated by the photodiode layer causes light emission from the stacked OLEDs; and the photodiode layer is configured to generate the photocurrent from light that falls within at least a first frequency band;

the stacked OLED is configured to generate light that falls within a second frequency band;

wherein the photodiode layer is configured to receive light of the second frequency band from the stacked OLED and generate additional photocurrent from the second frequency band as well as the first frequency band;

wherein the stacked OLED additionally comprises bottom and top electrodes electrically connected to a power source wherein the top electrode is transparent or semitransparent to the light of the second frequency band; which additionally comprises:

a substrate that is transparent to light of the first frequency band wherein:

the bottom electrode is at least partially transparent to light of the first frequency band, and the photodiode layer is located between the bottom and top electrodes of the stacked OLED; and wherein the power source provides a voltage bias that prevents the photodiode layer from generating a photocurrent from light that falls within at least a first frequency band for at least some period of time during operation.

17. A device wherein two optical upconverters are vertically stacked, each optical upconverter comprising a substrate with a photodiode layer coupled to a stacked organic light emitting diode (OLED), the stacked OLED comprising at least two OLED light-emitting units separated by a charge-generation layer (CGL);

wherein photocurrent generated by the photodiode layer causes light emission from the stacked OLEDs; and the photodiode layer is configured to generate the photocurrent from light that falls within at least a first frequency band;

the stacked OLED is configured to generate light that falls within a second frequency band;

wherein the photodiode layer is configured to receive light of the second frequency band from the stacked OLED and generate additional photocurrent from the second frequency band as well as the first frequency band;

wherein the stacked OLED additionally comprises bottom and top electrodes electrically connected to a power source wherein the top electrode is transparent or semitransparent to the light of the second frequency band, and wherein the top electrode of the bottom upconverter is common with the bottom electrode of the top upconverter and the photodiode layer in each upconverter responds to a different first frequency from the other and the stacked OLED in each upconverter generates light of a different second frequency from the other.

* * * * *